US008547626B2

(12) United States Patent
Tao et al.

(10) Patent No.: US 8,547,626 B2
(45) Date of Patent: Oct. 1, 2013

(54) MECHANICAL LAYER AND METHODS OF SHAPING THE SAME

(75) Inventors: Yi Tao, San Jose, CA (US); Fan Zhong, Fremont, CA (US); Teruo Sasagawa, Los Gatos, CA (US)

(73) Assignee: QUALCOMM MEMS Technologies, Inc., San Diego, CA (US)

(*) Notice: Subject to any disclaimer, the term of this patent is extended or adjusted under 35 U.S.C. 154(b) by 330 days.

(21) Appl. No.: 12/731,583

(22) Filed: Mar. 25, 2010

(65) Prior Publication Data

US 2011/0235155 A1 Sep. 29, 2011

(51) Int. Cl.
*G02B 26/00* (2006.01)

(52) U.S. Cl.
USPC .......................................................... 359/290

(58) Field of Classification Search
USPC ................................. 359/290–296
See application file for complete search history.

(56) References Cited

U.S. PATENT DOCUMENTS

| 4,663,181 A | 5/1987 | Murali |
| 4,710,732 A | 12/1987 | Hornbeck |
| 5,374,346 A | 12/1994 | Bladon et al. |
| 5,497,262 A | 3/1996 | Kaeriyama |
| 5,600,383 A | 2/1997 | Hornbeck |
| 5,638,946 A | 6/1997 | Zavracky |
| 5,784,212 A | 7/1998 | Hornbeck |
| 5,835,255 A | 11/1998 | Miles |
| 6,040,937 A | 3/2000 | Miles |
| 6,046,659 A | 4/2000 | Loo et al. |
| 6,219,015 B1 | 4/2001 | Bloom et al. |
| 6,650,455 B2* | 11/2003 | Miles ........................... 359/237 |
| 6,674,562 B1 | 1/2004 | Miles |
| 6,806,557 B2 | 10/2004 | Ding |
| 6,822,304 B1 | 11/2004 | Honer |
| 6,867,896 B2 | 3/2005 | Miles |
| 6,881,535 B2 | 4/2005 | Yamaguchi |
| 6,995,890 B2 | 2/2006 | Lin |
| 7,002,441 B2 | 2/2006 | Pillans et al. |
| 7,123,216 B1 | 10/2006 | Miles |
| 7,193,768 B2 | 3/2007 | Lin |

(Continued)

FOREIGN PATENT DOCUMENTS

| EP | 1 486 999 | 12/2004 |
| JP | 2002-243937 | 8/2002 |

(Continued)

OTHER PUBLICATIONS

Goldsmith et al., *Performance of Low-Loss RF MEMS Capacitive Switches*, IEEE Microwave and Guided Wave Letters, vol. 8, No. 8, Aug. 1998, p. 269-271

(Continued)

*Primary Examiner* — Scott J Sugarman
*Assistant Examiner* — Vipin Patel
(74) *Attorney, Agent, or Firm* — Knobbe, Martens Olson & Bear, LLP

(57) ABSTRACT

A method of shaping a mechanical layer is disclosed. In one embodiment, the method comprises depositing a support layer, a sacrificial layer and a mechanical layer over a substrate, and forming a support post from the support layer. A kink is formed adjacent to the support post in the mechanical layer. The kink comprises a rising edge and a falling edge, and the kink can be configured to control the shaping and curvature of the mechanical layer upon removal of the sacrificial layer.

35 Claims, 19 Drawing Sheets

(56) References Cited

U.S. PATENT DOCUMENTS

| | | |
|---|---|---|
| 7,321,457 B2 | 1/2008 | Heald |
| 7,327,510 B2 | 2/2008 | Cummings et al. |
| 7,329,917 B2 | 2/2008 | Patraw et al. |
| 7,373,026 B2 | 5/2008 | Chui |
| 7,385,762 B2 | 6/2008 | Cummings |
| 7,405,863 B2 | 7/2008 | Tung et al. |
| 7,527,995 B2 | 5/2009 | Sampsell |
| 7,564,613 B2 | 7/2009 | Sasagawa et al. |
| 7,566,940 B2 | 7/2009 | Sasagawa et al. |
| 7,567,373 B2 | 7/2009 | Chui et al. |
| 7,623,287 B2 | 11/2009 | Sasagawa et al. |
| 7,660,058 B2 | 2/2010 | Qiu et al. |
| 7,747,109 B2 | 6/2010 | Zhong et al. |
| 7,795,061 B2 | 9/2010 | Wang et al. |
| 2003/0021004 A1 | 1/2003 | Cunningham et al. |
| 2003/0036215 A1 | 2/2003 | Reid |
| 2004/0051929 A1 | 3/2004 | Sampsell et al. |
| 2004/0100677 A1 | 5/2004 | Huibers et al. |
| 2004/0207497 A1 | 10/2004 | Hsu et al. |
| 2004/0217919 A1 | 11/2004 | Pichl et al. |
| 2005/0098840 A1 | 5/2005 | Fuertsch et al. |
| 2006/0079048 A1 | 4/2006 | Sampsell et al. |
| 2006/0171628 A1 | 8/2006 | Naniwada |
| 2006/0203325 A1 | 9/2006 | Faase et al. |
| 2007/0042521 A1 | 2/2007 | Yama |
| 2007/0249078 A1 | 10/2007 | Tung et al. |
| 2008/0003710 A1 | 1/2008 | Kogut et al. |
| 2008/0013144 A1 | 1/2008 | Chui et al. |
| 2008/0180777 A1 | 7/2008 | Tung et al. |
| 2008/0278788 A1* | 11/2008 | Sasagawa ............ 359/224 |
| 2009/0147343 A1 | 6/2009 | Kogut et al. |
| 2009/0213450 A1 | 8/2009 | Sampsell |
| 2011/0115762 A1 | 5/2011 | Sasagawa et al. |

FOREIGN PATENT DOCUMENTS

| | | |
|---|---|---|
| JP | 2004-141995 | 5/2004 |
| WO | WO 03/046508 | 6/2003 |
| WO | WO 04/000717 | 12/2003 |
| WO | WO 2008-051351 A2 | 5/2008 |
| WO | WO 2009-006162 A2 | 1/2009 |
| WO | WO 2009-105373 A2 | 8/2009 |

OTHER PUBLICATIONS

Brosnihan et al., *Optical IMEMS—A Fabrication Process for MEMS Optical Switches With Integrated On-Chip Electronics*, The 12 International Conference on Solid State Sensors, Actuators and Microsystems, Boston, Jun. 8-12, 2003, p. 1638-1642.

Dokmeci et al., *Two-Axis Single-Crystal Silicon Micromirror Arrays, Journal of Microelectromechanical Systems*, vol. 13, No. 6, Dec. 2004, p. 1006-1017.

ISR and WO dated Nov. 16, 2011 in PCT/US11/028549.

IPRP dated May 30, 2012 in PCT/US11/028549.

Written Opinion of the International Preliminary Examining Authority dated Apr. 5, 2012 in PCT/US12/028649.

* cited by examiner

|  | +V_bias | -V_bias |
|---|---|---|
| 0 | Stable | Stable |
| +ΔV | Relax | Actuate |
| −ΔV | Actuate | Relax |

Column Output Signals

Row Output Signals

US 8,547,626 B2

MECHANICAL LAYER AND METHODS OF SHAPING THE SAME

FIELD OF THE INVENTION

This invention relates to electromechanical systems devices and, more particularly, to shaping for mechanical layers in such devices and systems.

BACKGROUND

Electromechanical systems, such as microelectromechanical systems (MEMS), include micro mechanical elements, actuators, and electronics. Micromechanical elements may be created using deposition, etching, and or other micromachining processes that etch away parts of substrates and/or deposited material layers or that add layers to form electrical and electromechanical devices. One type of electromechanical systems device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a flexible membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

Figure 1:
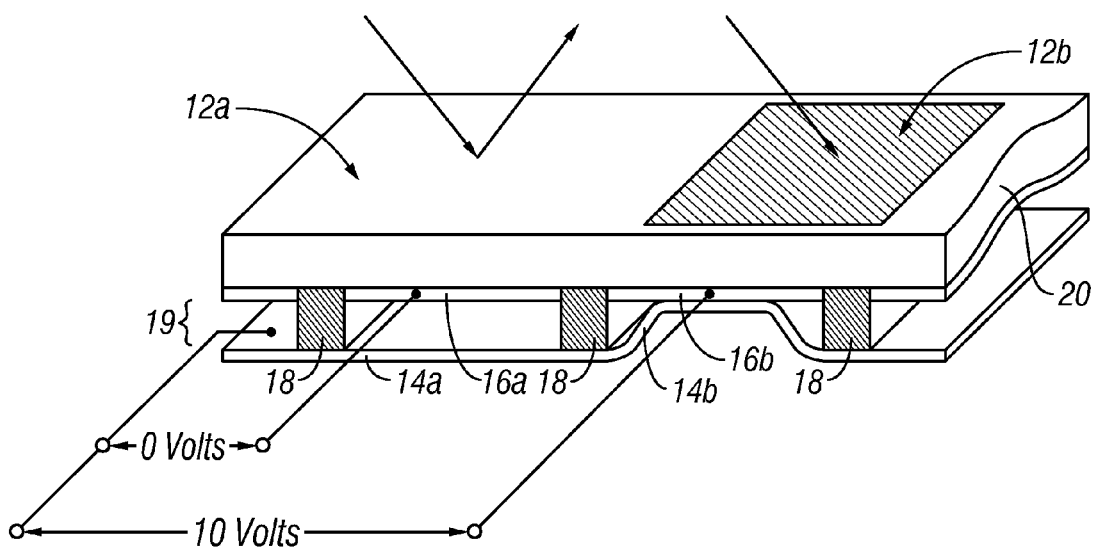
FIG. 1 is an isometric view depicting a portion of one embodiment of an interferometric modulator display in which a moveable reflective layer of a first interferometric modulator is in a relaxed position and a moveable reflective layer of a second interferometric modulator is in an actuated position.

In one embodiment, an electromechanical system device includes a substrate, a support structure, and a mechanical layer having an actuated position and a relaxed position. The support structure is on the substrate and supports the mechanical layer, and is configured to space the mechanical layer from the substrate to define a collapsible gap. The gap is in a collapsed condition when the mechanical layer is in the actuated position and in a non-collapsed condition when the mechanical layer is in the relaxed position. The mechanical layer includes a kink adjacent to the support structure. The kink includes a rising portion and a falling portion, wherein the rising portion extends away from the gap and the falling portion extends toward the gap when the mechanical layer is in the relaxed position.

In another embodiment, an electromechanical system device includes a substrate means, a deformable means having a relaxed and an actuated position, and a support means. The support means supports the deformable means and spaces the deformable means from the substrate by a collapsible gap. The collapsible gap is in a collapsed condition when the deformable means is in the actuated position and in a non-collapsed condition when the deformable means is in the relaxed position. The deformable means includes a shaping means for directing curvature of the deformable means.

In another embodiment, a method is provided for shaping a mechanical layer in an electromechanical systems device. The method includes providing a substrate and depositing a support layer over at least a portion of the substrate. The method further includes forming a support post from at least the support layer, and providing a mechanical layer with a kink adjacent to the support post, wherein the kink includes a rising edge and a falling edge. Furthermore, the method includes supporting the mechanical layer with the support post to define a collapsible gap over the substrate.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

DETAILED DESCRIPTION OF EMBODIMENTS

The following detailed description is directed to certain specific embodiments. However, the teachings herein can be applied in a multitude of different ways. In this description, reference is made to the drawings wherein like parts are designated with like numerals throughout. The embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). Electromechanical systems devices of similar structure to those described herein can also be used in non-display applications such as in electronic switching devices.

A device is disclosed having one or more kinks formed from the mechanical layer in the vicinity of and surrounding at least a portion of a support post and configured to control the curvature and shaping of the mechanical layer after release. The kink can be configured so that the displacement of the mechanical layer relative to the support post is controlled and so that the mechanical layer has the desired curvature after release. Additionally, the kink can be configured so that the moveable reflective layer is substantially flat when a bias voltage is applied to the mechanical layer during operation. The kinks can also be configured to improve the switching characteristics of the device when transitioning between actuated (closed) and relaxed (open) positions. In particular, it can be desirable that the transition between the actuated and relaxed positions occurs over a narrow band of voltage. Accordingly, the kink can be shaped so as to aid relaxation of the mechanical layer from the actuated position, thereby improving device switching characteristics.

Reference will now be made to the Figures.

One interferometric modulator display embodiment comprising an interferometric electromechanical systems display element is illustrated in FIG. 1. In these devices, the pixels are in either a bright or dark state. In the bright ("relaxed" or "open") state, the display element reflects a large portion of incident visible light to a user. When in the dark ("actuated" or "closed") state, the display element reflects little incident visible light to the user. Depending on the embodiment, the light reflectance properties of the "on" and "off" states may be reversed. Electromechanical systems pixels can be configured to reflect predominantly at selected colors, allowing for a color display in addition to black and white.

FIG. 1 is an isometric view depicting two adjacent pixels in a series of pixels of a visual display, wherein each pixel comprises an electromechanical systems interferometric modulator. When such devices are formed with dimensions on the order of tens to hundreds of microns, they are often referred to in the art as microelectromechanical (MEMS) devices. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the moveable reflective layer is positioned at a relatively large distance from a fixed partially reflective layer. In the second position, referred to herein as the actuated position, the moveable reflective layer is positioned more closely adjacent to the partially reflective layer. Incident light that reflects from the two layers interferes constructively or destructively depending on the position of the moveable reflective layer, producing either an overall reflective or non-reflective state for each pixel.

The depicted portion of the pixel array in FIG. 1 includes two adjacent interferometric modulators 12a and 12b. In the interferometric modulator 12a on the left, a moveable reflective layer 14a is illustrated in a relaxed position at a predetermined distance from an optical stack 16a, which includes a partially reflective layer. In the interferometric modulator 12b on the right, the moveable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The moveable reflective layers 14a, 14b may be formed as a series of parallel strips of a deposited metal layer or layers (orthogonal to the row electrodes of 16a, 16b) to form column electrodes deposited on top of posts 18 and an intervening sacrificial material deposited between the posts 18. When the sacrificial material is released or etched away, the moveable reflective layers 14a, 14b are separated from the optical stacks 16a, 16b by a defined gap 19. A highly conductive and reflective material such as aluminum may be used for the moveable reflective layers 14a, 14b, and these strips may form column electrodes in a display device. Note that FIG. 1 may not be to scale. In some embodiments, the spacing between posts 18 may be on the order of 10-100 um, while the gap 19 may be on the order of <1000 Angstroms.

With no applied voltage, the gap 19 remains between the moveable reflective layer 14a and optical stack 16a, with the moveable reflective layer 14a in a mechanically relaxed state, as illustrated by the pixel 12a in FIG. 1. However, when a potential (voltage) difference is applied to a selected row and column, the capacitor formed at the intersection of the row and column electrodes at the corresponding pixel becomes charged, and electrostatic forces pull the electrodes together. If the voltage is high enough, the moveable reflective layer 14b is deformed and is forced against the optical stack 16b. A dielectric layer (not illustrated in this Figure) within the optical stack 16 may prevent shorting and control the separation distance between the actuated moveable reflective layer 14b and the conductive layer(s) of the optical stack 16, as illustrated by actuated pixel 12b on the right in FIG. 1. The behavior is the same regardless of the polarity of the applied potential difference.

FIGS. 2 through 5 illustrate one exemplary process and system for using an array of interferometric modulators in a display application.

Figure 2:
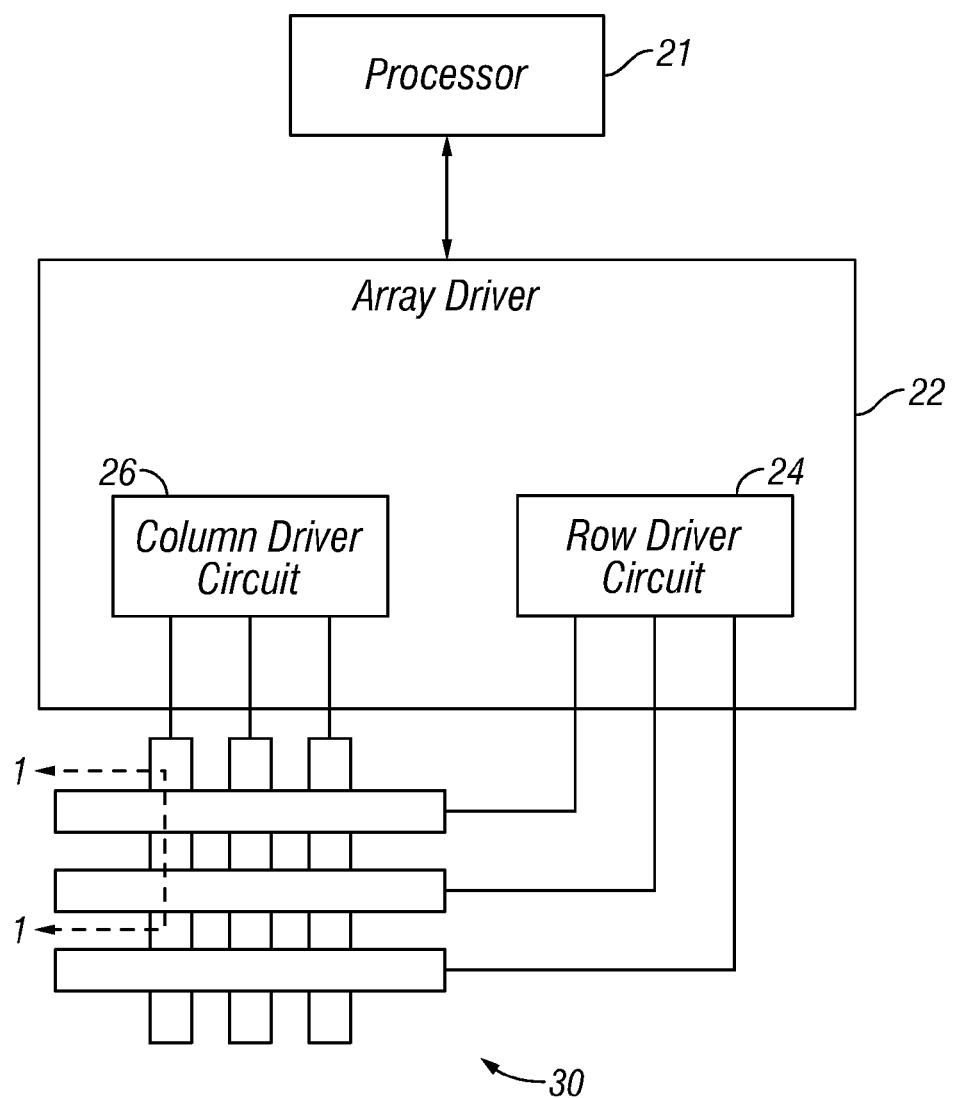
FIG. 2 is a system block diagram illustrating one embodiment of an electronic device incorporating a 3×3 interferometric modulator display.

FIG. 2 is a system block diagram illustrating one embodiment of an electronic device that may incorporate interferometric modulators. The electronic device includes a processor 21 which may be any general purpose single- or multi-chip microprocessor such as an ARM®, Pentium®, 8051, MIPS®, Power PC®, or ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. Note that although FIG. 2 illustrates a 3×3 array of interferometric modulators for the sake of clarity, the display array 30 may contain a very large number of interferometric modulators, and may have a different number of interferometric modulators in rows than in columns (e.g., 300 pixels per row by 190 pixels per column).

Figures 3, 4:
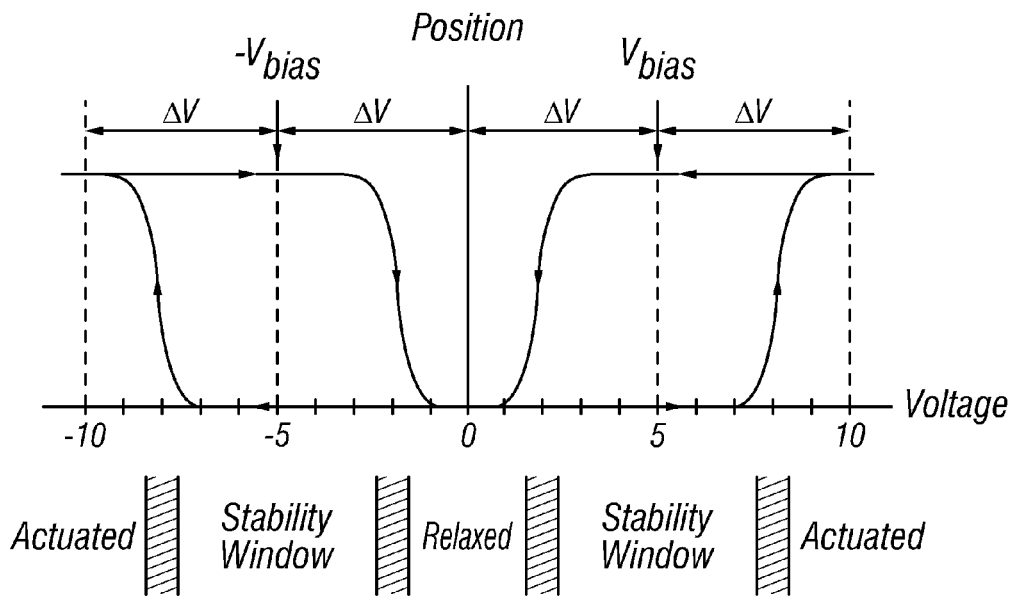
FIG. 3 is a diagram of moveable mirror position versus applied voltage for one exemplary embodiment of an interferometric modulator of FIG. 1.
FIG. 4 is an illustration of a set of row and column voltages that may be used to drive an interferometric modulator display.

FIG. 3 is a diagram of moveable minor position versus applied voltage for one exemplary embodiment of an interferometric modulator of FIG. 1. For electromechanical systems interferometric modulators, the row/column actuation protocol may take advantage of a hysteresis property of these devices as illustrated in FIG. 3. An interferometric modulator may require, for example, a 10 volt potential difference to cause a moveable layer to deform from the relaxed state to the actuated state. However, when the voltage is reduced from that value, the moveable layer maintains its state as the voltage drops back below 10 volts. In the exemplary embodiment of FIG. 3, the moveable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state or bias voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

As described further below, in typical applications, a frame of an image may be created by sending a set of data signals (each having a certain voltage level) across the set of column electrodes in accordance with the desired set of actuated pixels in the first row. A row pulse is then applied to a first row electrode, actuating the pixels corresponding to the set of data signals. The set of data signals is then changed to correspond to the desired set of actuated pixels in a second row. A pulse is then applied to the second row electrode, actuating the appropriate pixels in the second row in accordance with the data signals. The first row of pixels are unaffected by the second row pulse, and remain in the state they were set to during the first row pulse. This may be repeated for the entire series of rows in a sequential fashion to produce the frame. Generally, the frames are refreshed and/or updated with new image data by continually repeating this process at some desired number of frames per second. A wide variety of protocols for driving row and column electrodes of pixel arrays to produce image frames may be used.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
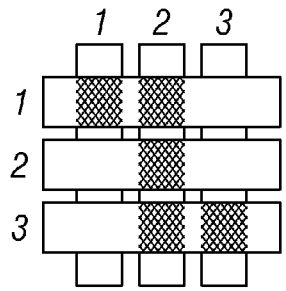
FIGS. 5A and 5B illustrate one exemplary timing diagram for row and column signals that may be used to write a frame of display data to the 3×3 interferometric modulator display of FIG. 2.
Figure 5B:
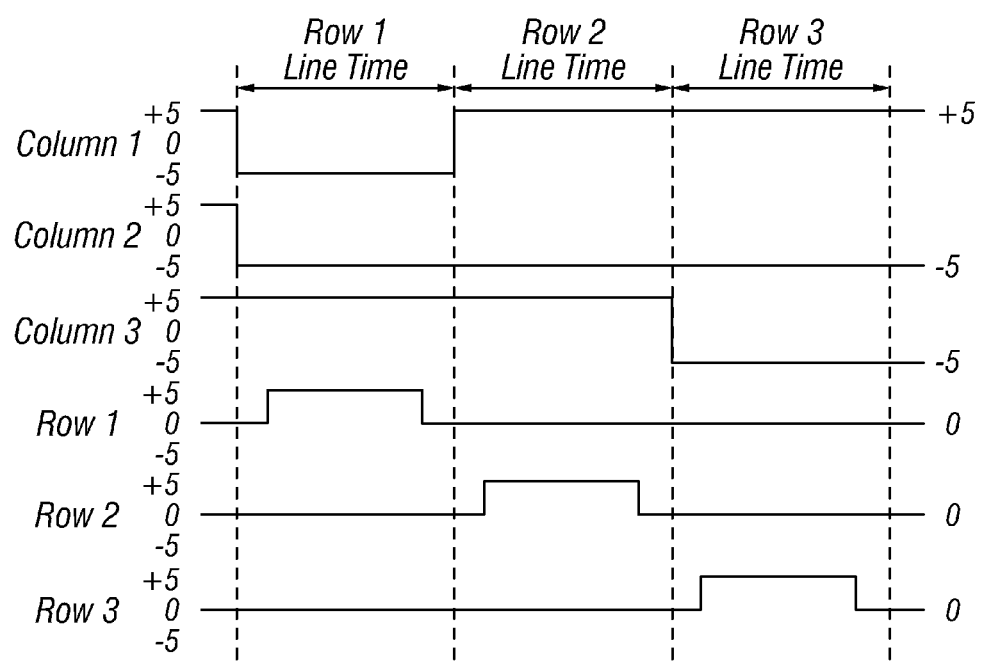

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are initially at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. The same procedure can be employed for arrays of dozens or hundreds of rows and columns. The timing, sequence, and levels of voltages used to perform row and column actuation can be varied widely within the general principles outlined above, and the above example is exemplary only, and any actuation voltage method can be used with the systems and methods described herein.

Figure 6A:
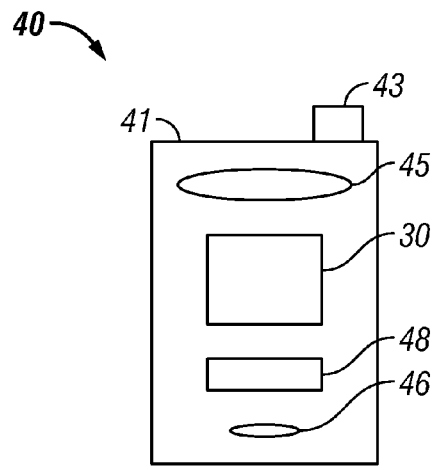
FIGS. 6A and 6B are system block diagrams illustrating an embodiment of a visual display device comprising a plurality of interferometric modulators.
Figure 6B:
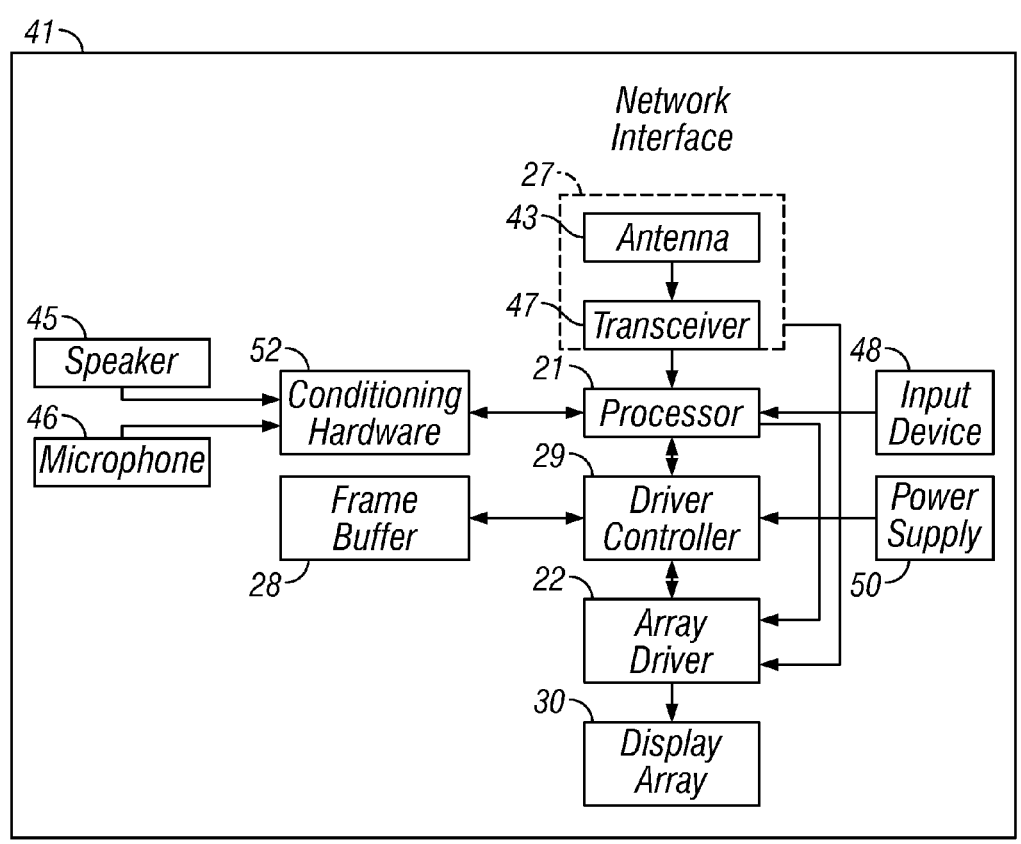

FIGS. 6A and 6B are system block diagrams illustrating an embodiment of a display device 40. The display device 40 can be, for example, a cellular or mobile telephone. However, the same components of the display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, W-CDMA, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. The above-described optimization may be implemented in any number of hardware and/or software components and in various configurations.

Figure 7A:
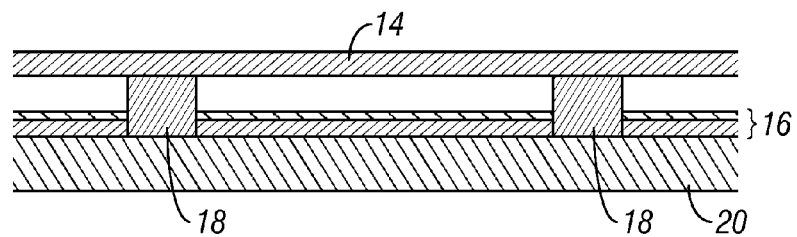
FIG. 7A is a cross section of the device of FIG. 1.
Figure 7B:
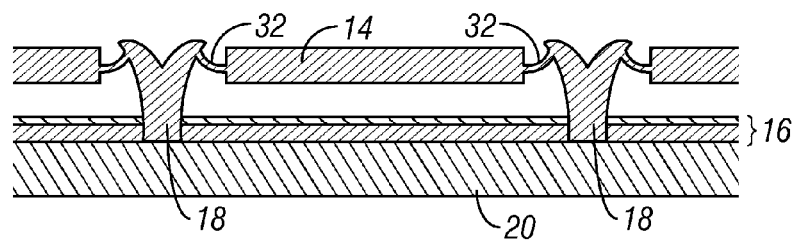
FIG. 7B is a cross section of an alternative embodiment of an interferometric modulator.
Figure 7C:
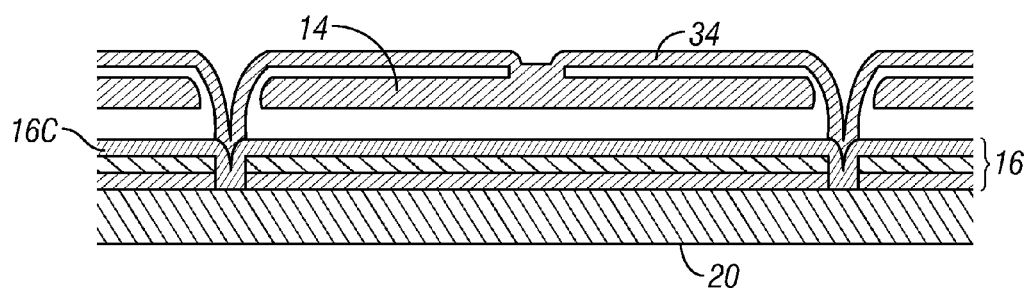
FIG. 7C is a cross section of another alternative embodiment of an interferometric modulator.
Figure 7D:
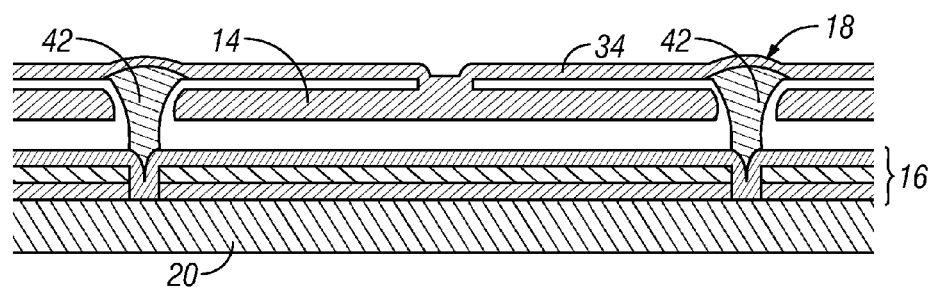
FIG. 7D is a cross section of yet another alternative embodiment of an interferometric modulator.
Figure 7E:
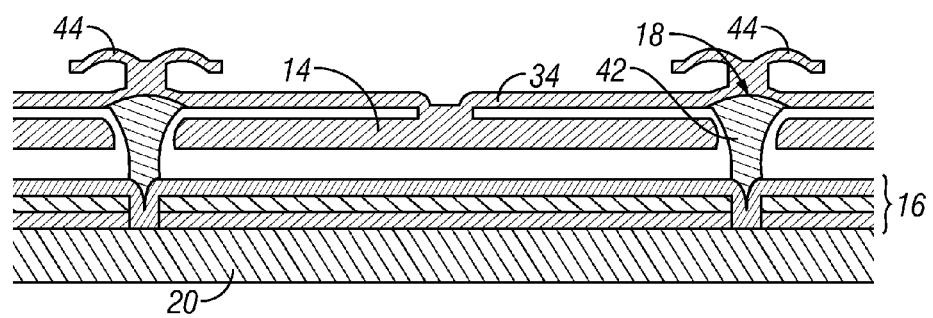
FIG. 7E is a cross section of an additional alternative embodiment of an interferometric modulator.

The details of the structure of interferometric modulators that operate in accordance with the principles set forth above may vary widely. For example, FIGS. 7A-7F illustrate six different embodiments of the moveable reflective layer 14 and its supporting structures. FIG. 7A is a cross section of the embodiment of FIG. 1, where a moveable reflective layer 14 is deposited on orthogonally extending posts 18. In this example, the moveable electrode for electromechanical operation is the mechanical layer. In FIG. 7B, the moveable reflective layer 14 of each interferometric modulator is square or rectangular in shape and attached to supports at the corners only, on tethers 32. In this example, the moveable electrode can be conceptually separated from the mechanical layer or could be considered a stiffer portion of the mechanical layer. In FIG. 7C, the moveable reflective layer 14 is square or rectangular in shape and serves as a moveable electrode suspended from a deformable or mechanical layer 34, which may comprise a flexible metal. The mechanical layer 34 connects, directly or indirectly, to the substrate 20 around the perimeter of the mechanical layer 34. The connections are herein referred to as supports 18. The embodiment illustrated in FIG. 7D has supports 18 formed by plugs 42 upon which the mechanical layer 34 rests. The moveable reflective layer 14 remains suspended over the gap, as in FIGS. 7A-7C, but the mechanical layer 34 does not form the supports 18 by filling holes between the mechanical layer 34 and the optical stack 16. Rather, the supports 18 are formed of a planarization material, which is used to form plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

Figure 7F:
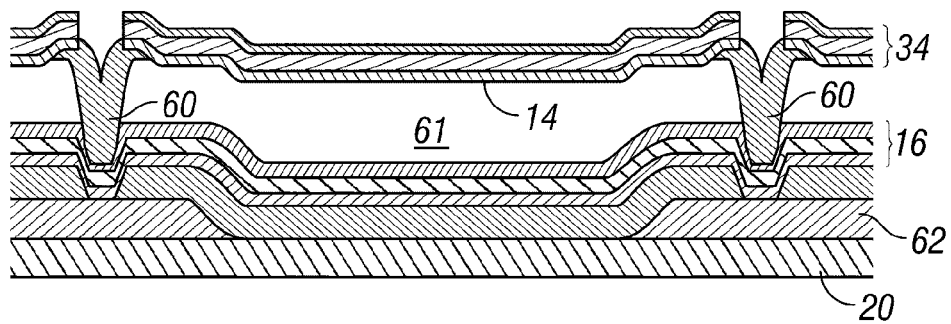
FIG. 7F is a cross section of another additional alternative embodiment of an interferometric modulator.

FIG. 7F illustrates another embodiment, wherein the mechanical layer 34 includes a moveable reflective layer 14. The mechanical layer 34 rests on support posts 60 and is separated from the optical stack 16 by a gap 61. The illustrated mechanical layer 34 also includes a conductive layer 36, which may be configured to serve as an electrode, and a support layer 35. In one embodiment, the support layer is a dielectric layer of, for example, SiON. The moveable reflective layer 14 and the conductive layer 36 can comprise, e.g., AlCu. Employing conductors 14, 36 above and below the dielectric support layer 35 can balance stresses and provide enhanced conduction. The illustrated embodiment also includes a black mask structure 62, which can be adapted for a variety of purposes, such as to absorb light. In embodiments, the black mask 62 can be an etalon or interferometric stack structure, including conductive absorbers that can additionally bus signals between lower, stationary electrodes. As can be seen in FIGS. 7C and 7F, the mechanical layer can serve as support for the moveable electrode or can serve as the moveable electrode itself. Thus, in some embodiments, the moveable electrode and the mechanical layer can be the same physical layer.

In embodiments such as those shown in FIGS. 7A-7F, the interferometric modulators function as direct-view devices, in which images are viewed from the front side of the transparent substrate 20, the side opposite to that upon which the modulator is arranged. In these embodiments, the moveable reflective layer 14 optically shields the portions of the interferometric modulator on the side of the reflective layer opposite the substrate 20, including the mechanical layer 34. This allows the shielded areas to be configured and operated upon without negatively affecting the image quality. For example, such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the moveable reflective layer 14 from its mechanical properties, which are carried out by the mechanical layer 34. This allows the structural design and materials used for the moveable reflective layer 14 to be optimized with respect to the optical properties, and the structural design and materials used for the mechanical layer 34 to be optimized with respect to desired mechanical properties.

Figure 8:
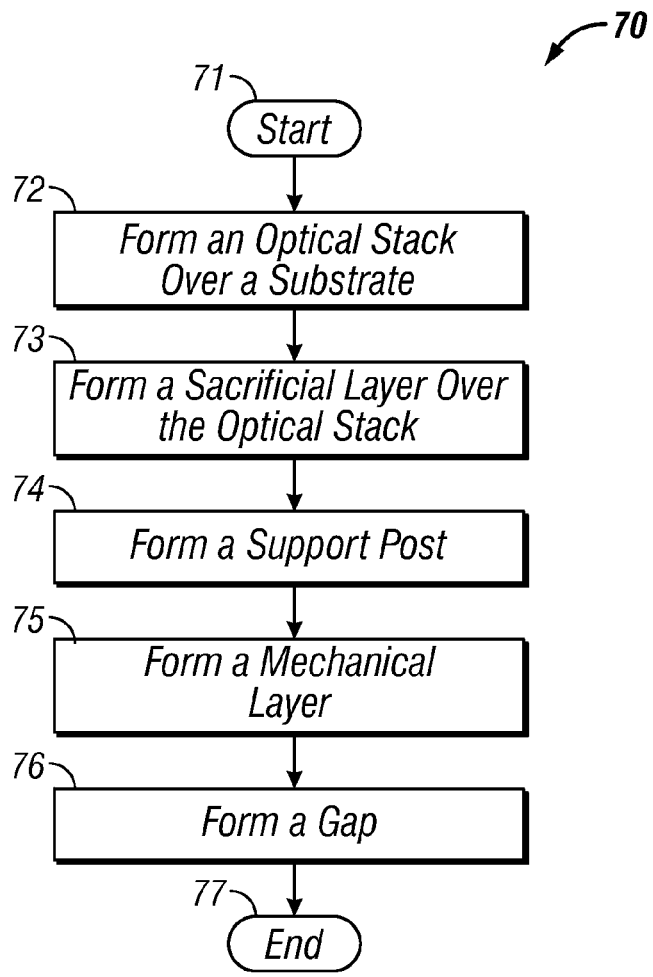
FIG. 8 is a flow chart illustrating one embodiment of a manufacturing process for an interferometric modulator.

FIG. 8 illustrates one embodiment of a manufacturing process for an optical modulator, such as an interferometric modulator. It will be understood that not all of the illustrated steps are required, and that this method can be modified without departing from the spirit and scope of the invention. Such steps may be present in a process for manufacturing, for example, the interferometric modulators illustrated in FIGS. 1 and 7.

With reference to FIGS. 1, 7 and 8, the process 70 starts at 71. In an ensuing step 72, a stationary electrode such as the optical stack 16 is formed over the substrate 20. The substrate 20 can be a transparent substrate comprising glass or plastic. Although the process 70 is illustrated as starting at 71, the substrate 20 can be subjected to one or more prior preparation steps such as, for example, a cleaning step to facilitate efficient formation of the optical stack 16. Additionally, in some embodiments one or more layers are provided before forming the optical stack 16 over the substrate 20. For example, with reference to FIG. 7F, in one embodiment the black mask 62 is provided before forming the optical stack 16. As discussed above, the optical stack 16 for an interferometric modulator can be electrically conductive, partially transparent and partially reflective, and can be fabricated, for example, by depositing one or more of the layers onto the transparent substrate 20. In some embodiments, the layers are patterned into parallel strips, and may form row electrodes in a display device. As used herein, and as will be understood by one of skill in the art, the term "patterned" is used herein to refer to masking as well as etching processes. In some embodiments, the optical stack 16 includes an insulating or dielectric layer covering conductive layer(s).

The process 70 illustrated in FIG. 8 continues to a step 73, in which a sacrificial layer is formed over the optical stack 16. The sacrificial layer is later removed to form a gap (e.g., 61 of FIG. 7F), as will be discussed below. Accordingly, the sacrificial layer is not shown in the resulting interferometric modulator illustrated in FIG. 7F. The formation of the sacrificial layer over the optical stack 16 may include deposition of a fluorine-etchable material such as molybdenum (Mo) or amorphous silicon, in a thickness selected to provide, after subsequent removal, a gap 61 having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

The process 70 illustrated in FIG. 8 continues at step 74 with the formation of a support structure, such as the support post 60 illustrated in FIG. 7F. The formation of the support post 60 may include the steps of patterning the sacrificial layer to form a support structure aperture, then depositing a material (e.g., a polymer or a silicon oxide) into the aperture using a deposition method such as PECVD, thermal CVD, or spin-coating. In some embodiments, the support structure aperture formed in the sacrificial layer extends through both the sacrificial layer and the optical stack 16 to the underlying substrate 20, so that the lower end of the support post 60 contacts the substrate 20. In other embodiments, the aperture formed in the sacrificial layer extends through the sacrificial layer, but not through the optical stack 16. For example, FIG. 7D illustrates the lower end of the plugs 42 in contact with the optical stack 16.

The process 70 illustrated in FIG. 8 continues at step 75 with the formation of a mechanical layer such as the mechanical layer 34 illustrated in FIG. 7F. The mechanical layer 34 can be formed by employing one or more deposition steps, e.g., reflective layer (e.g., aluminum, aluminum alloy) deposition, along with one or more patterning, masking, and/or etching steps. As discussed above, the mechanical layer can be electrically conductive, and in some embodiments may serve as the moveable electrode (e.g., FIG. 7A wherein the moveable reflective layer 14 is the mechanical layer). However, in other embodiments, another layer besides the mechanical layer 34 can serve as a moveable electrode, such as, for example, the moveable reflective layer 14 in FIG. 7D. Since the sacrificial layer is still present in the partially fabricated interferometric modulator formed at step 75 of the process 70, the mechanical layer 34 is typically not moveable at this stage. A partially fabricated interferometric modulator that contains a sacrificial layer may be referred to herein as an "unreleased" interferometric modulator.

The process 70 illustrated in FIG. 8 continues at step 76 with the formation of a gap, e.g., the gap 61 illustrated in FIG. 7F. The gap 61 may be formed by exposing the sacrificial material, such as the sacrificial material deposited at the step 73, to an etchant. For example, an etchable sacrificial material such as Mo, W, Ta or polycrystalline or amorphous silicon may be removed by dry chemical etching, for example, by exposing the sacrificial layer to a fluorine-based gaseous or vaporous etchant, such as vapors derived from solid xenon difluoride ($XeF_2$). As skilled artisans will recognize, the sacrificial layer can be exposed for a period of time that is effective to remove the material, typically selectively relative to the structures surrounding the gap 61. Other selective etching methods, for example, wet etching and/or plasma etching, can also be used. Since the sacrificial layer is removed during step 76 of the process 70, the moveable reflective layer 14 and/or mechanical layer 34 is released at this stage, and the mechanical layer 34 can become displaced away from the substrate by a launch height due to mechanical stress. Additionally, the mechanical layer can change shape or curvature at this point for a variety of reasons, such as mechanical stresses. The resulting fully or partially fabricated interferometric modulator may be referred to herein as a "released" or "launched" interferometric modulator. The illustrated method ends at 77. The skilled artisan will readily appreciate that many additional steps may be employed before, in the middle of, or after the illustrated sequence, but are omitted for simplicity.

There is a need for the ability to control the launch height of the mechanical layer upon release. The mechanical layer can become displaced away from the substrate upon release due to mechanical stresses. Although a bias voltage can be applied between the mechanical layer 34 and the optical stack 16 to aid in flattening the mechanical layer 34, the mechanical layer 34 can remain displaced away from the substrate by a distance equal to about the launch height even after application of bias. Thus, the mechanical layer 34 can have a gap height under bias which is equal to about the thickness of the sacrificial layer plus the launch height. For an interferometric modulator (IMOD) embodiment, a gap height can correspond to a particular reflected color, and thus it can be desirable to control the launch height so that the sacrificial layer thickness needed for a particular gap size is desirable from a fabrication and optical performance standpoint. For example, thick sacrificial layers can be costly to deposit and can be difficult to etch without leaving residue, while thin sacrificial layers can be difficult to uniformly deposit. Additionally, a large sacrificial layer thickness can produce a large bending height of the mechanical layer 34 when in the actuated position, which can increase the brightness of the portion of the mechanical layer out of contact with the optical stack 16 during actuation, thereby degrading the black state and reducing the display's contrast ratio, gamut, and color saturation. Thus, there is a need for selectively increasing the launch height when the sacrificial layer thickness needed for a particular gap size is undesirably thick, and for selectively decreasing the launch height when the sacrificial layer thickness needed for a particular gap size is undesirably thin.

Additionally, there is a need for improved control of the shaping and curvature of the mechanical layer after release. As described above with reference to FIG. 3, an interferometric device can be exposed to a bias voltage difference so that the device retains state. In embodiments in which the bias voltage is applied between the mechanical layer 34 and the optical stack 16, the bias voltage produces electrostatic forces which act to pull the mechanical layer 34 toward the optical stack 16. In a preferred embodiment, an interferometric device in the relaxed or open state is substantially flat when under bias, so that the optical properties of the device are optimum in the relaxed state. Accordingly, there exists a need to shape the mechanical layer before release to control the shaping and curvature of the moveable reflective layer 14 after release and upon application of bias.

Furthermore, there is a need to control the shaping and curvature of the moveable mechanical layer to improve the switching characteristics of the interferometric device when transitioning between actuated and relaxed positions. In particular, as illustrated in FIG. 3, it is desirable to have a sharp slope in the hysteresis curve when transitioning between states to increase the stability window and to improve the optical properties in the actuated and relaxed states. In one IMOD embodiment, the mechanical layer is shaped such that portions of the mechanical layer along the sides, center, and corners of the pixel release from the substrate at substantially the same voltage, thereby aiding relaxation from the actuated position.

FIGS. 9A to 9K illustrate a process for forming an electromechanical systems device having controlled shaping and curvature of the mechanical layer 34 according to one embodiment. While particular parts and steps are described as suitable for interferometric modulator implementation, it will be understood that for other electromechanical systems implementations, different materials can be used or parts modified, omitted, or added.

Figure 9A:
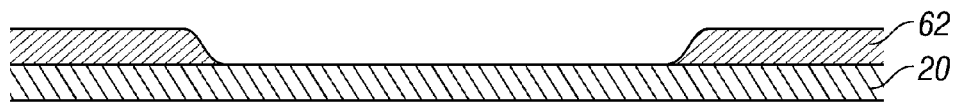
FIGS. 9A through 9K are schematic cross-sections illustrating a manufacturing process for an interferometric modulator according to one embodiment.

In FIG. 9A, a black mask structure 62 has been provided on a substrate 20. The substrate 20 can comprise a variety of materials, including glass or a transparent polymeric material which permits images to be viewed through the substrate 20. The black mask structure 62 can be configured to absorb ambient or stray light in optically inactive regions (e.g., beneath supports or between pixels) to improve the optical properties of a display device by increasing the contrast ratio. Additionally, the black mask structure 62 can be conductive and be configured to function as an electrical bussing layer. In one embodiment, the row electrodes are connected to the black mask structure 62 to reduce the resistance of the connected row electrode.

The black mask structure 62 can be formed using a variety of methods, including deposition and patterning techniques as described above with reference to FIG. 8. The black mask structure 62 can comprise one or more layers. In one embodiment, the black mask structure 62 comprises a MoCr layer that serves as an optical absorber, a $SiO_2$ layer, and an aluminum alloy that serves as a reflector and a bussing layer, with a preferred thickness in the range of about 30-80 Å, 500-1000 Å, and 500-5000 Å, respectively. The layers can be patterned using a variety of techniques, including photolithography and a dry etch comprising, for example, $CF_4$ and/or $O_2$ for the MoCr and $SiO_2$ layers and $Cl_2$ and/or $BCl_3$ for the aluminum alloy layer.

Although FIGS. 9A to 9K are shown as including the black mask structure 62, persons of ordinary skill in the art will recognize that this is for illustrative purposes only, and that the methods of controlling curvature and shaping a mechanical layer as described herein can be equally applicable to processes lacking the black mask structure 62. In particular, there are a variety of ways to form a kink in a mechanical layer, so as to control the shaping and curvature of the mechanical layer 34 after release, as will be described in further detail below. However, the illustrated method conveniently employs otherwise functional layers in place of separate patterning steps to define the kink.

Figure 9B:
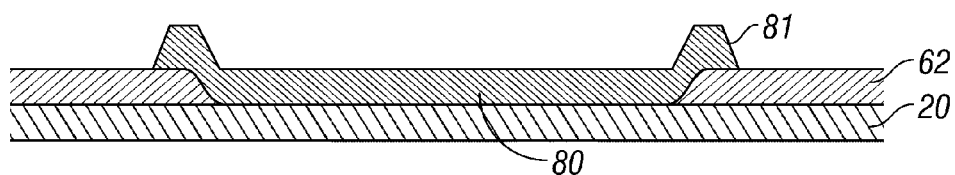

FIG. 9B illustrates providing a shaping structure 80 over the substrate 20. The shaping structure 80 may comprise a buffer oxide, such as $SiO_2$, which aids in maintaining a relatively planar profile across the substrate by filling in gaps between bussing or black mask structures 62. In one embodiment, the shaping structure 80 has a thickness in the range of about 100-6000 Å. The thickness of the shaping structure 80 can be selected to produce stresses in the unreleased mechanical layer that produce a desired launch height upon release. As described above, the thickness needed for the sacrificial layer for a given desired gap height can be controlled by adjusting the launch height of the mechanical layer upon release, which in turn can be affected by the shaping structure 80. In particular, the shaping structure 80 can be used to form a kink in the mechanical layer, as will be described in detail below. The thickness of the shaping structure 80 can be used to adjust the relative heights of the rising and falling portions of the kink, thereby controlling the stresses in the mechanical layer and achieving the desired launch height. In the illustrated example, the thickness of the shaping structure 80 affects the rising portion 91 (see FIG. 9K) while the thickness of the black mask 62 affects the falling portion 92 (see FIG. 9K). Thus, sacrificial layer thickness can be selected which can easily be deposited and which does not produce a large bending height of the mechanical layer 34. A large bending height of the mechanical layer can increase the brightness of the portion of the mechanical layer out of contact with the optical stack 16 during actuation, thereby degrading the black state and reducing the display's contrast ratio, gamut, and color saturation. The shaping structure 80 can be formed using a variety of techniques, such as by deposition and patterning, as described in detail above with reference to FIG. 8.

The shaping structure 80 can be used to form a kink in the mechanical layer 34, as will be discussed below. In particular, one or more layers, including the mechanical layer, can be deposited over the shaping structure 80, thereby substantially replicating one or more geometric features of the shaping structure 80. For example, as illustrated in FIG. 9B, the shaping structure 80 can overlap the black mask structure 62, thereby forming a protrusion 81. The protrusion 81 can produce an upwardly extending wave or kink in a subsequently deposited conformal layer, such as the mechanical layer 34, as will be described in further detail below.

Figure 9C:
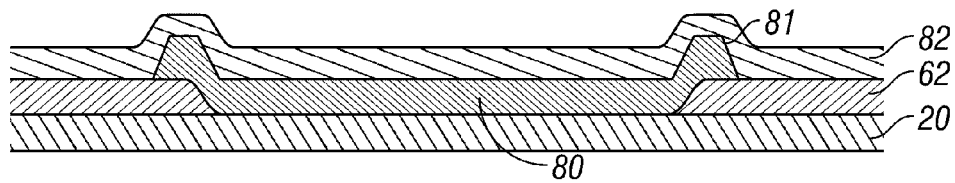
Figure 9D:
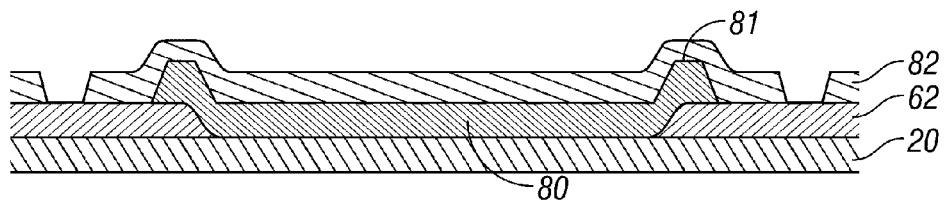

FIGS. 9C and 9D illustrate providing and patterning a dielectric structure 82. The dielectric structure 82 can comprise, for example, SiON and/or another dielectric material such as a silicon nitride or silicon oxide. In one embodiment, the thickness of the dielectric structure 82 is in the range of about 3000-5000 Å. However, as skilled artisans will recognize, the dielectric structure 82 can have a variety of thicknesses depending on the desired optical properties. In some embodiments the dielectric structure can be removed over a portion above the black mask structure 62, such as to permit routing and row electrode layers to reach the black mask structure 62, such as in embodiments in which the black mask structure 62 serves to bus signals. As illustrated in FIG. 9D, the dielectric structure is conformal such that the protrusion 81 has produced a kink in the dielectric layer, which can be propagated up to subsequently deposited layers, as shown in FIGS. 9E-9K.

Figure 9E:
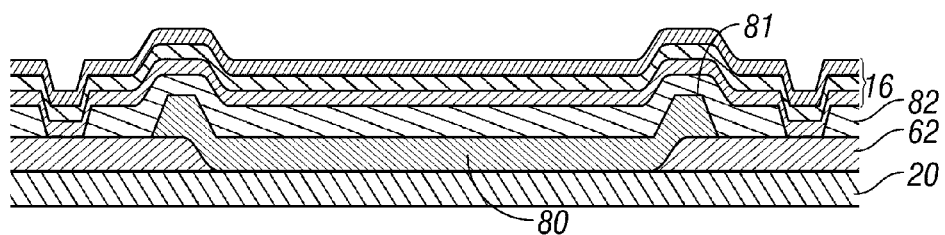

FIG. 9E illustrates providing an optical stack 16 over the dielectric structure 82. As described above with reference to FIG. 1, the optical stack 16 typically comprises several layers, which can include an optional transparent conductor, such as indium tin oxide (ITO), a partially reflective optical absorber layer, such as chromium, and a transparent dielectric. In one embodiment, the optical stack 16 comprises a MoCr layer having a thickness in the range of about 30-80 Å, a $AlO_x$ layer having a thickness in the range of about 50-150 Å, and a $SiO_2$ layer having of thickness in the range of about 250-500 Å. The separate transparent conductor can be omitted in favor of employing the black mask structure 62 to bus signals among pixels of the array, such that the thin, semitransparent absorber layer serves to provide conductivity sufficient for the optical stack 16 to serve as the stationary electrode for the electrostatic operation. The optical stack 16 can thus be electrically conductive, partially transparent and partially reflective. The absorber layer can be formed from a variety of materials that are partially reflective such as various metals, semiconductors, and dielectrics. The partially reflective layer can be formed of one or more layers, and each of the layers can be formed of a single material or a combination of materials. In some embodiments, the layers of the optical stack 16 are patterned into parallel strips, and may form row electrodes in a display device as described above with reference to FIG. 1. As illustrated in FIG. 9E, one or more layers of the optical stack 16 may physically and electrically contact the black mask 62.

Figure 9F:
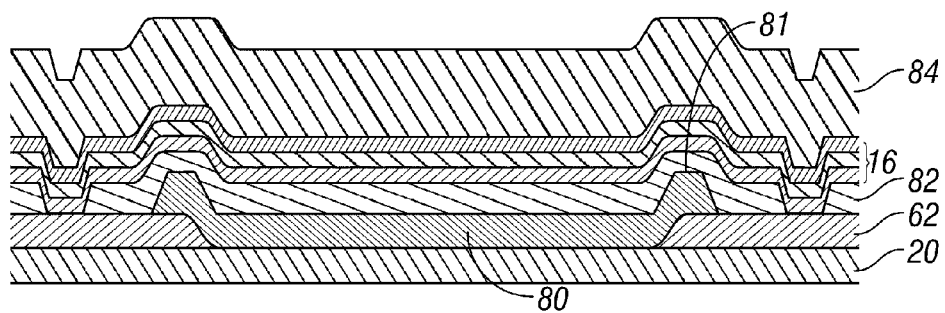
Figure 9G:
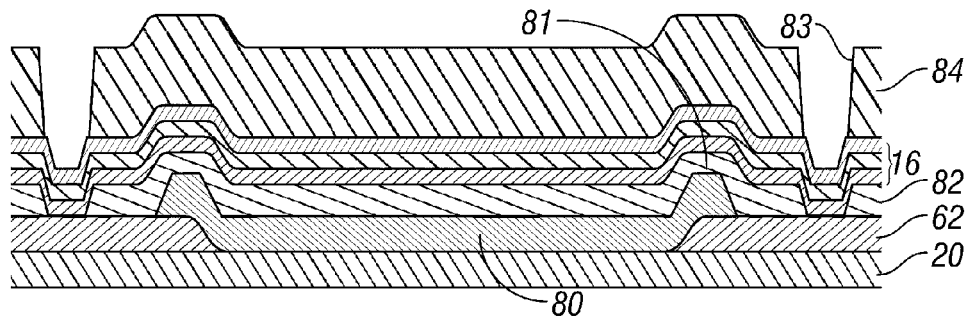

FIGS. 9F-9G illustrate providing and patterning a sacrificial layer 84 over the optical stack 16. The sacrificial layer 84 is typically later removed to form a gap (e.g., 61 of FIG. 7F). The formation of the sacrificial layer 84 over the optical stack 16 can include a deposition step, as described above with reference to FIG. 8. Additionally, the sacrificial layer 84 can be selected to comprise more than one layer, or comprise a layer of varying thickness, to aid in the formation of a display device having a multitude of resonant optical gaps. For an IMOD array, each gap size can represent a different reflected color. Moreover, in some embodiments, multiple layers of different functions can be provided, over or between sacrificial layers (e.g., the moveable reflective layer 14 in FIG. 7D). As illustrated in FIG. 9G, the sacrificial layer may be patterned to form vias 83 so as to aid in the formation of support posts, as will be described below.

Figure 9H:
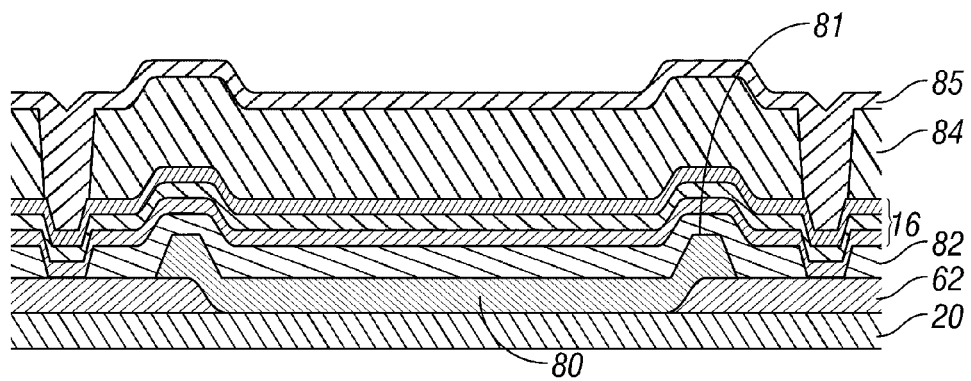
Figure 9I:
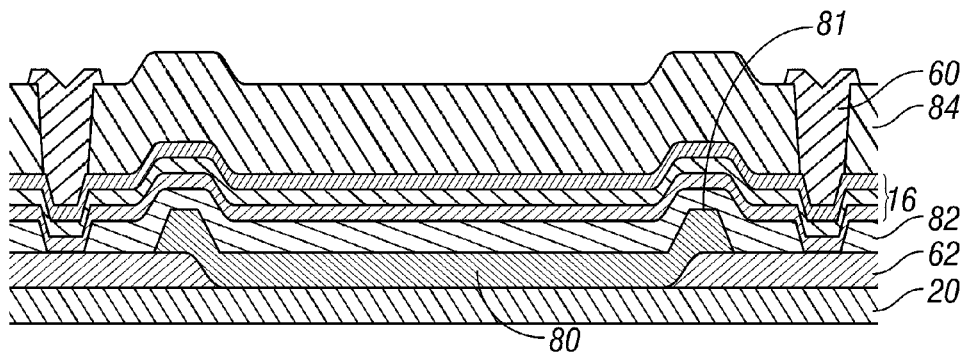

FIGS. 9H-9I illustrate providing and patterning a support layer 85 to form the support posts 60. The support layer 85 may comprise, for example, $SiO_2$ and/or SiON, and the support layer 85 may be patterned to form the support posts 60 in the vias 83 by a variety of techniques, such as using a dry etch including $CF_4$.

Figure 9J:
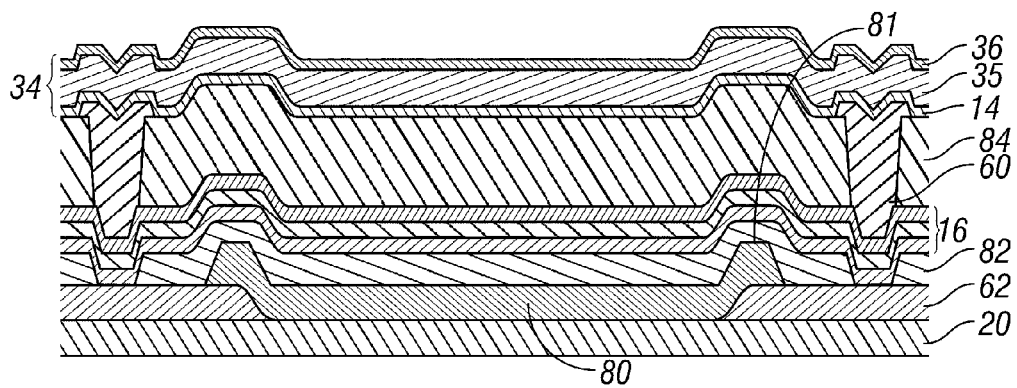
Figure 9K:
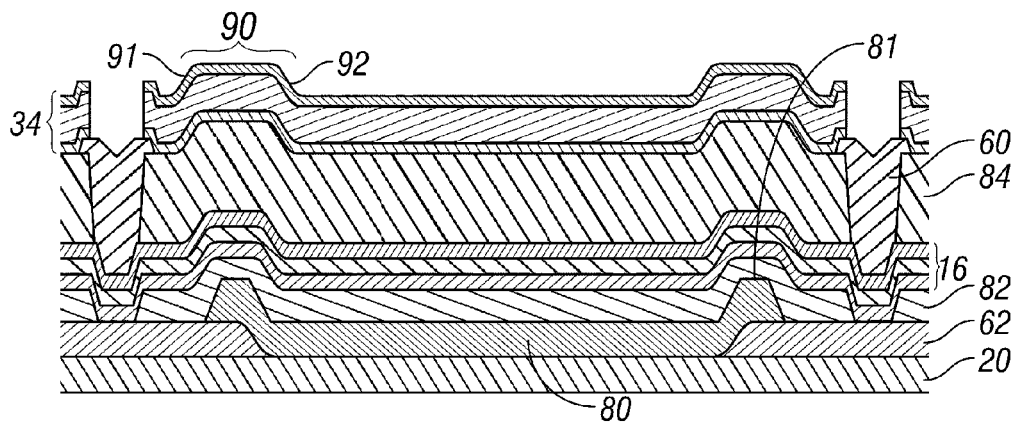

FIGS. 9J-9K illustrate providing a mechanical layer 34 over the sacrificial layer and patterning the mechanical layer. The mechanical layer 34 can comprise more than one layer, such as, for example, a conductive layer 36, a support layer 35, and a moveable reflective layer 14. In one embodiment, the support layer is a dielectric layer of, for example, SiON. The moveable reflective layer 14 and the conductive layer 36 can comprise, e.g., metallic materials (e.g., AlCu with about 0.5% Cu by weight). Conductors 14, 36 above and below the dielectric support layer 35 can balance stresses and provide enhanced conduction. However, the mechanical layer can comprise a single layer, such as the moveable reflective layer 14 (e.g., FIG. 7A). Skilled artisans will appreciate that the mechanical layer 34 can comprise a variety of layers, depending upon the electromechanical systems device functions. For example, the mechanical layer can be configured to function as the moveable electrode (e.g., FIG. 7A) or to support the moveable electrode (e.g., FIG. 7D).

The skilled artisan will appreciate that for purposes of illustration the sequence and drawings have been simplified to omit some details not relevant to the principles and advantages taught herein. For example, in a color interferometric display system, multiple different devices may have different gap sizes to interferometrically enhance, for example, red, green, and blue. Similarly, three different mechanical layer materials or thicknesses can be employed to allow use of the same actuation voltage for collapsing the mechanical layer in three different gap sizes.

FIG. 9K illustrates an interferometric device prior to removal of the sacrificial layer 84. The sacrificial layer may be removed at this point using a variety of methods, as described above with reference to FIG. 8. After release, the mechanical layer 34 can become displaced away from the substrate by a launch height and can change shape or curvature at this point for a variety of reasons, such as mechanical stresses. By providing the mechanical layer 34 over the shaping structure 80, and particularly over the protrusion 81, with the intervening layers formed conformally, a kink 90 is formed in the mechanical layer 34. The geometric features of the kink 90 can be controlled by varying the geometry of the shaping structure 80.

In one embodiment of the invention, the kink 90 is shaped to control the "launch" effect upon release of the mechanical layer 34. By choosing the geometry of the shaping structure 80, the height and shape of the rising and falling portions of the kink can be manipulated, thereby controlling the stresses in the mechanical layer 34. Thus, the kink 90 can be shaped to control the launch height of the mechanical layer upon release. Control of the launch height can allow the selection of a sacrificial layer thickness needed for a particular gap size which is desirable from a fabrication and optical performance standpoint.

Additionally, the kink 90 can be employed to shape the mechanical layer 34 when under a bias. As described above, an interferometric device can be exposed to a bias voltage difference so that the device retains state. In one embodiment, the kink 90 is shaped to control the curvature of the mechanical layer after release, and so that the mechanical layer is substantially flat when under bias.

In another embodiment, the kink 90 is shaped to control the curvature of the mechanical layer to improve the switching characteristics of the interferometric device when transitioning between actuated and relaxed positions. In particular, as illustrated in FIG. 3, in a display embodiment it is desirable to have a sharp slope in the hysteresis curve when transitioning between states to increase the stability window and to improve the optical properties in the actuated and relaxed states. Accordingly, the mechanical layer 34 can be shaped such that a portions of the mechanical layer 34 along the sides, center, and corners of the pixel release from the substrate at substantially the same voltage, thereby aiding relaxation from the actuated position. In a preferred embodiment, the minor curvature is selected to be concave down when the mechanical layer is not under bias. For certain processes, a concave down curvature can aid the mechanical layer in relaxing from the actuated position and can have an improved slope in the hysteresis curve as compared to a mechanical layer having a flat or concave up curvature when the mechanical layer is not under bias.

The illustrated kink 90 includes a rising portion 91 and a falling portion 92. When the mechanical layer 34 is in the relaxed position, the rising portion 91 extends away from the gap 61 and the falling portion 92 extends toward the gap 62. The height of the rising portion 91 and the height of the falling portion 92 can be selected to control the mechanical stresses in the mechanical layer 34 prior to release. For example, the rising portion 91 and the falling portion 92 can contact the mechanical layer 34 at points of equal height when the mechanical layer 34 is in the relaxed position, such that a line drawn through the points of contact is substantially parallel to the mechanical layer 34. In one embodiment, the rising portion 91 is spaced from the falling portion 92 by a width of less than about 5 μm. In another embodiment, the kink 90 has a thickness of the mechanical layer which is substantially equal along the rising portion 91, the falling portion 92, and portions of the mechanical layer adjacent to the kink 90. In yet another embodiment, the height of the rising and falling portions are selected to be substantially equal, thereby balancing edge stresses in the unreleased mechanical layer 34. Although the rising portion 91 and falling portion 92 are illustrated as not touching, in some embodiments the rising and falling portions can meet without an intervening plateau.

As will become clearer from the plan views in FIGS. 10A and 10E discussed below, the kinks 90 can be configured to collectively surround a portion of one or more support posts 60. For example, one or more portions of a kink 90 can be positioned close to the edges of the device (e.g., pixel for an IMOD display), in a close proximity of one or more support posts 60, such as, for example, by less than about 5 μm or less than about a width of a support post, and can be configured to surround one or more sides of the support posts 60.

In one embodiment, the height of the kink 90 is selected to be in the range of about 100-6000 Å, or more particularly 400-5000 Å. In another embodiment, the width of the kink is elected to be in the range of about 0.2 μm-5 μm, or more particularly, about 0.5 μm-2 μm.

The process described in FIGS. 9A-9K illustrates one method of forming a kink 90 in the mechanical layer 34. Although the method illustrated in FIGS. 9A-9K describes forming a kink in the mechanical layer 34 by depositing a mechanical layer over a protrusion in the underlying layers, skilled artisans will recognize many alternatives methods of forming a kink are possible. In one embodiment, the shaping structure is formed first in the active device area, and another layer, such as, for example, the black mask structure, is subsequently formed to overlap the edges of the shaping layer, thereby forming a protrusion in the same location as the protrusion of FIGS. 9A-9K. In another embodiment, a gap between a shaping structure (e.g., 102 in FIGS. 11A-11C) and the black mask structure 62 can produce a downwardly extending kink in a subsequently deposited mechanical layer, as described in detail with reference to FIGS. 11A-11C below. In yet another embodiment, rather than using an overlap or gap of two or more layers, a single layer could be deposited and patterned, such as, for example, the sacrificial layer. In yet another embodiment, the mechanical layer is patterned to form the kink. As persons of ordinary skill in the art will recognize, a wide variety of methods exist by which a kink can be formed having geometries substantially similar to that described herein.

Figure 10A:
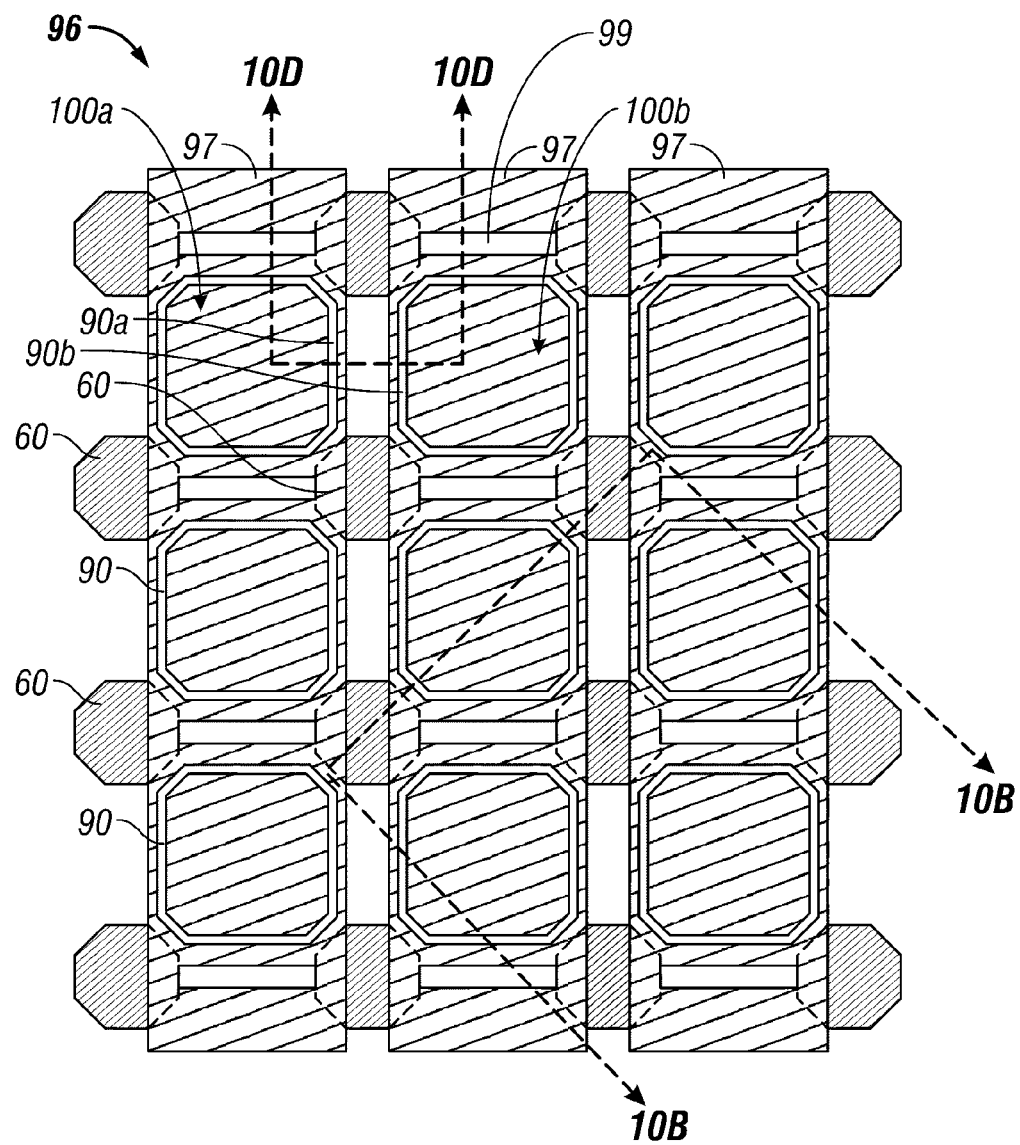
FIG. 10A illustrates a top plan view of an interferometric device array according to the process of FIGS. 9A-9K.

FIG. 10A illustrates a top plan view of an interferometric device array according to one embodiment. The illustrated device array 96 includes support posts 60 and column electrodes 97 formed from the mechanical layer. The width, location, and density of the support posts 60 can vary depending on a variety of factors. In one embodiment, the support post 60 has a width of about 5-20 μm. Additionally, the spacing between the support posts can vary depending on a variety of factors, including the desired optical properties and process node. In one embodiment, the spacing between adjacent support posts is selected to be in the range of about 20-300 μm.

The column electrodes 97 may be used for array addressing, as described above with reference to FIG. 1. Additionally, the column electrodes 97 can include slots 99, which can be used to mechanically disconnect adjacent IMOD devices (e.g., pixels or sub-pixels) within the same column. Row electrodes for the device array 96 run cross-wise to the column electrodes 97 and are formed by the optical stacks 16 seen in FIGS. 9E-9K. The intersection of column electrodes and row electrodes can define the boundaries or active regions of individual electromechanical systems devices, which for an IMOD embodiment represent pixels. As illustrated in FIG. 10A, the column electrodes 97 can be formed from the mechanical layer 34, which can include kinks, such as a kink 90.

The kink 90 can be positioned at a variety of distances and orientations relative to the support posts 60. In one embodiment, the kink 90 is spaced from the support post 60 by less than about 5 μm. In another embodiment, the kink 90 is spaced from the support post 60 by less than about the shortest lateral dimension of the support post 60. The kink 90 can comprise a set of discrete shapes or, as illustrated in FIG. 10A, the kink 90 can take the form of an elongated rail along a side of the support post 60. In one embodiment, one or more kinks collectively surround greater than about 25 percent of the perimeter of the support post 60. As illustrated in FIG. 10A, in one embodiment the kink 90 can comprise a closed shape around the perimeter of the mechanical layer portion for each pixel. In another embodiment, the kink 90 comprises a line, a curve, a broken shape, or a set of discrete points.

In one embodiment, the kink 90 is formed above the black mask structure 62 (FIG. 9K). More particularly, the kink is formed within about 5 μm of an edge of the black mask structure 62. In the illustrated embodiment, the kink 90 straddles an edge of the black mask structure 62.

Figure 10B:
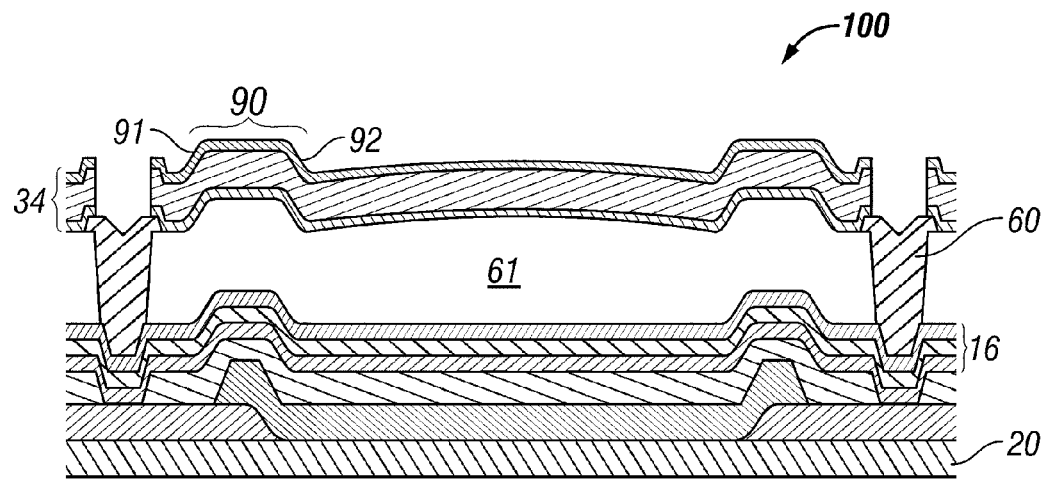
FIG. 10B illustrates a cross-sectional view of one interferometric device of the interferometric device array of FIG. 10A taken along the lines 10B-10B of FIG. 10A.

FIG. 10B illustrates a cross-sectional view of one interferometric device of the interferometric device array of FIG. 10A taken along the lines 10B-10B of FIG. 10A. The illustrated interferometric device 100 includes a support post 60, a mechanical layer 34, a kink 90 and an optical stack 16 formed over a substrate 20. In contrast to the mechanical layer 34 shown in FIG. 9K, the illustrated mechanical layer 34 has been released, i.e., the sacrificial layer has been removed. The shaping of the kink 90 has resulted in the mechanical layer 34 having a concave down curvature upon release. Additionally, in the illustrated interferometric device 100, the height of the rising portion 91 and the falling portion 92 have been selected to be substantially equal, thereby balancing edge stresses between opposite ends of the kink 90.

Figure 10C:
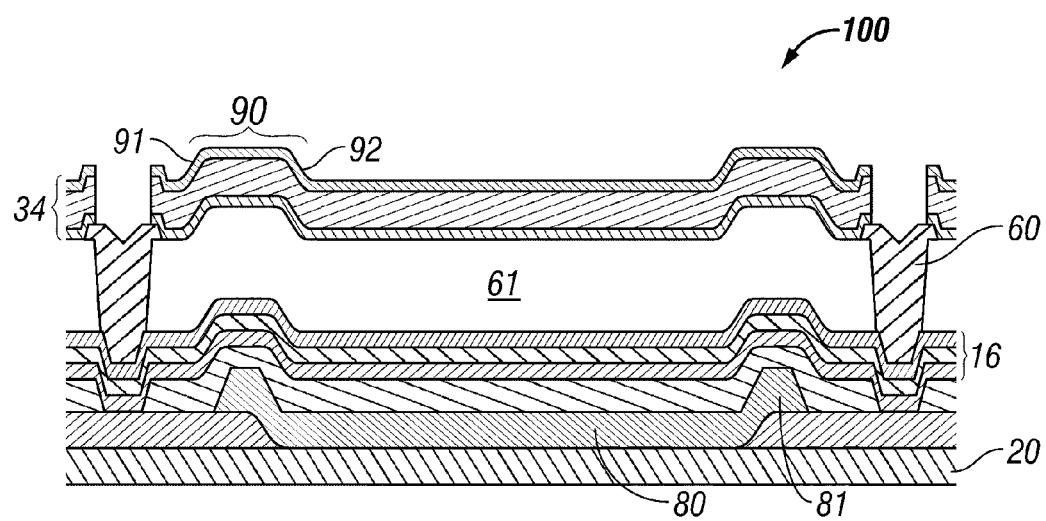
FIG. 10C illustrates a cross-sectional view of the interferometric device of FIG. 10B under bias.

FIG. 10C illustrates a cross-sectional view of the interferometric device of FIG. 10B under bias. As described above with reference to FIG. 3, in the open or unactuated state, an electromechanical systems device (e.g., an interferometric modulator device) can be exposed to a bias voltage. The illustrated moveable reflective layer 14 is substantially flat in the relaxed state when under bias, so that the optical properties of the device are optimum in the relaxed or open state. The substantial flatness of the moveable reflective layer 14 is a result of the shaping caused by the kink 90. Absent the kink 90, the curvature of the mechanical layer 34 can be concave up upon release and thus non-correctable by application of bias. Thus, the kink 90 can be employed to improve, e.g., the optical properties of an interferometric device.

Figure 10D:
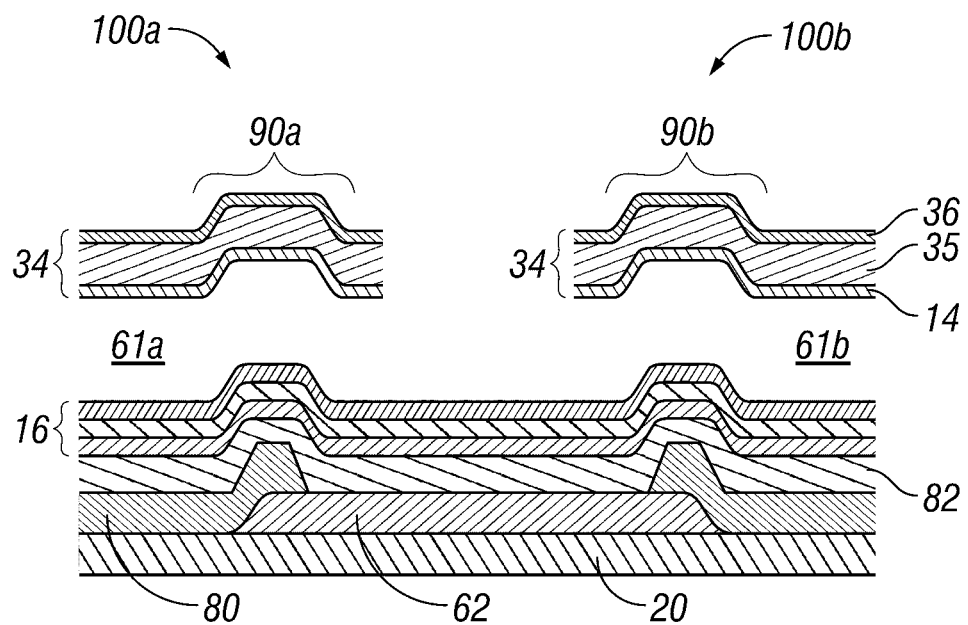
FIG. 10D illustrates a cross-sectional view at a boundary of two interferometric devices of the interferometric device array of FIG. 10A taken along the lines 10D-10D of FIG. 10A.

FIG. 10D illustrates a cross-sectional view at a boundary of two interferometric devices of the interferometric device array of FIG. 10A taken along the lines 10D-10D of FIG. 10A. As shown, a first interferometric device 100a includes a kink 90a formed in the mechanical layer 34. The mechanical layer 34 is suspended over the optical stack 16 to form a gap 61a. Likewise, a second interferometric device 100b can include a kink 90b formed in the mechanical layer 34, which can be suspended over the optical stack by a gap 61b. The illustrated kinks 90a, 90b can be formed, for example, from the overlap of the shaping layer 80 and the black mask 62, in a manner similar to that described above with reference to FIGS. 9A-9K. Thus, even in a region away from a support post, one or more kinks can be formed in the mechanical layer in order to aid in controlling, for example, launch height and curvature of the mechanical layer upon release.

Figure 10E:
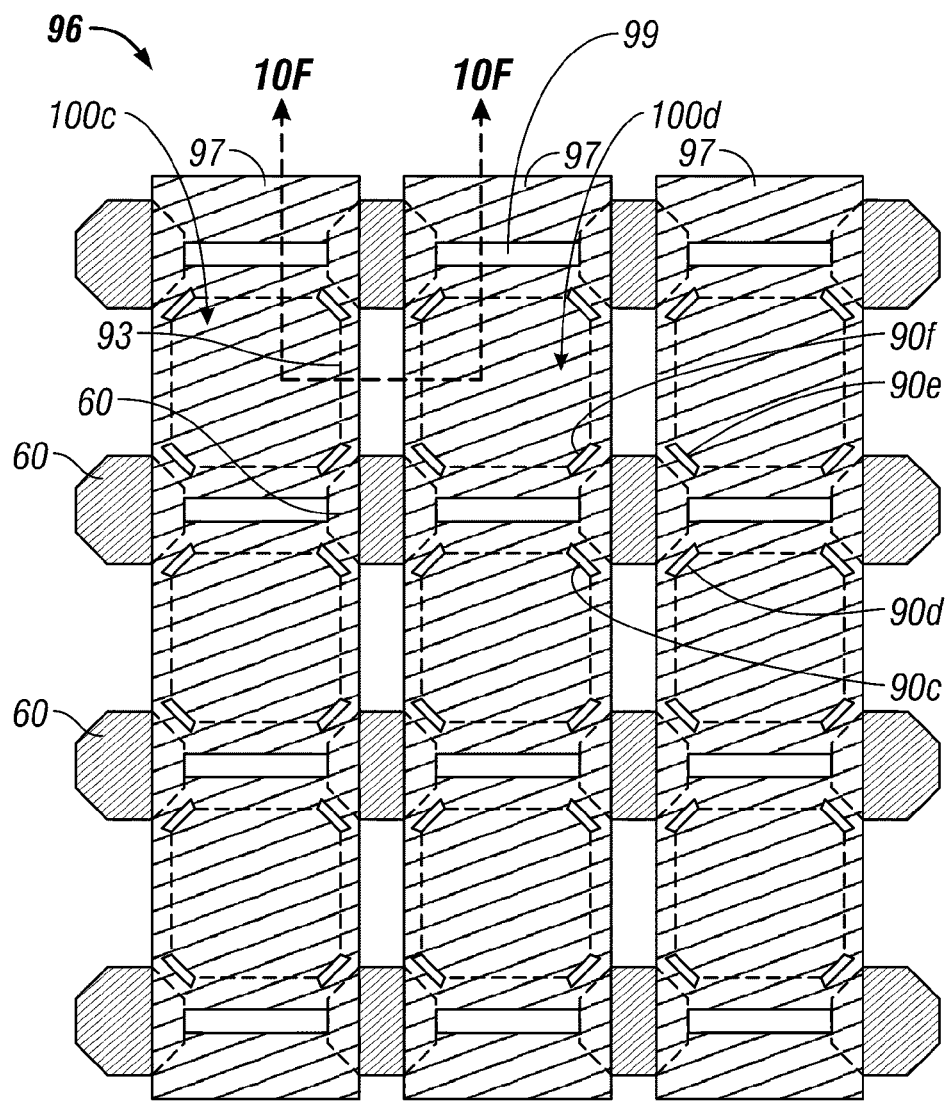
FIG. 10E illustrates a top plan view of an interferometric device array according to the process of FIGS. 9A-9K in accordance with another embodiment.

FIG. 10E illustrates a top plan view of an interferometric device array according to one embodiment. The illustrated device array 96 includes support posts 60, and column electrodes 97 and slots 99 formed from the mechanical layer. The width, location, and density of the support posts 60 can vary depending on a variety of factors, as was discussed above with reference to FIG. 10A. The mechanical layer further includes kinks and edges 93, as will be described in further detail below.

As shown in FIG. 10E, one or more kinks can collectively surround the perimeter of the support post 60. For example, a first kink 90c, a second kink 90d, a third kink 90e, and a fourth kink 90f can surround the perimeter of a support post 60. Although the first, second, third, and fourth kinks 90c-f are illustrated as surrounding about 50% of the perimeter of a support post, the size or number of kinks can be varied to surround more of, or less of, the perimeter of a support post. As described above with reference to FIG. 10A, the kink can comprise a line, a curve, a broken shape, or a set of discrete points.

Figure 10F:
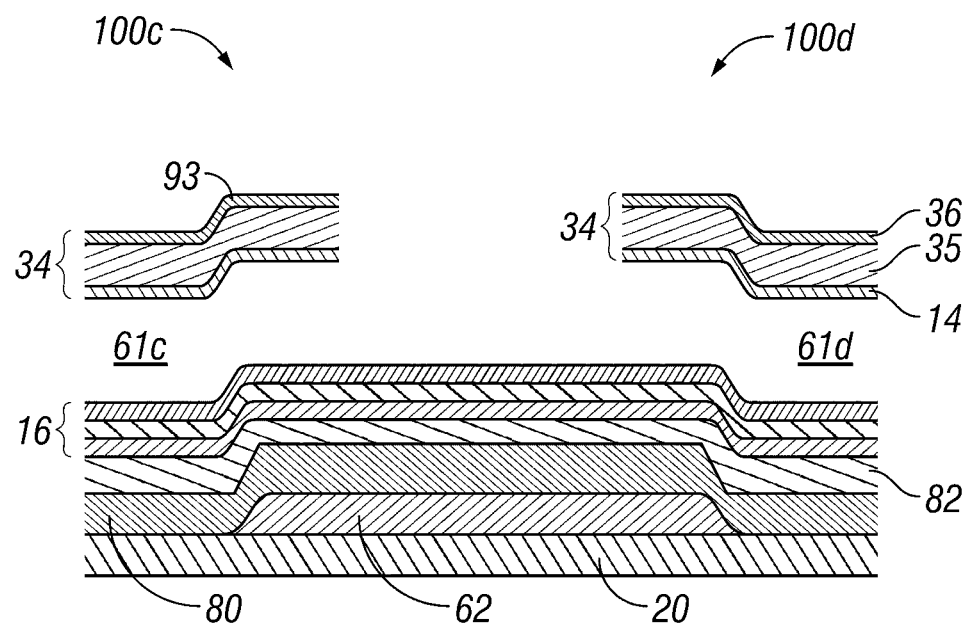
FIG. 10F illustrates a cross-sectional view of the interferometric device of the interferometric device array of FIG. 10E taken along the lines 10E-10F of FIG. 10E.

FIG. 10F is a cross-sectional view at a boundary of two interferometric devices of the interferometric device array of FIG. 10E taken along the lines 10E-10F of FIG. 10E. As shown, a first interferometric device 100c includes a portion of the mechanical layer 34 suspended over the optical stack 16 to form a gap 61c, and a second interferometric device 100d having a portion of the mechanical layer 34 suspended over the optical stack 16 to form a gap 61d. In contrast to the interferometric devices illustrated in FIG. 10D, the illustrated portion of the interferometric devices 100c, 100d do not include a kink. Rather, the devices 100c, 100d each include only a falling edge 93 resulting from the processing of the underlying layers (the shaping layer 80 extends across pixels in this region).

Figure 11A:
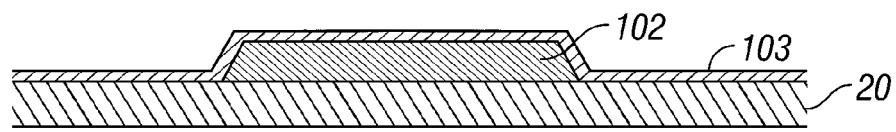
FIGS. 11A through 11C are schematic cross sections illustrating a manufacturing process for an interferometric modulator according to another embodiment.
Figure 11B:
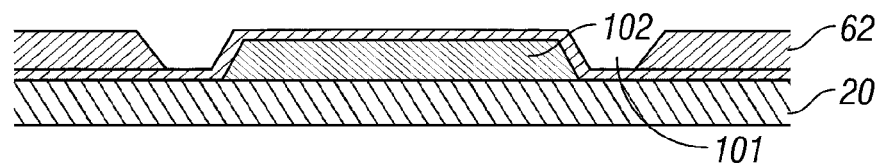
Figure 11C:
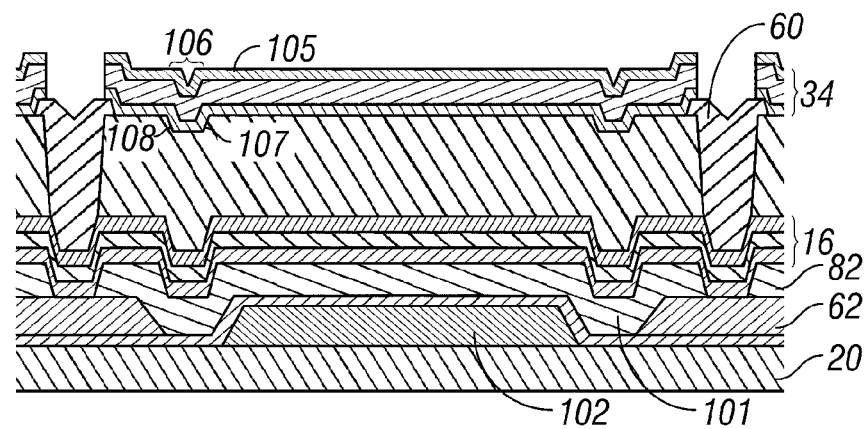

FIG. 11A-11C illustrates a process for forming an interferometric device having controlled shaping and curvature of the mechanical layer 34 according to another embodiment. Although the concave up shaping of the mechanical layer 34 resulting from the process of FIGS. 11A-11C can be non-optimal in some optical applications, the ability to shape the mechanical layer curvature in this manner can be useful. For example, in some applications, a concave up mechanical layer shape may be desirable. Additionally, if properties of the materials and/or process node resulted in a tendency for the mechanical layer to be concave down after release, the inclusion of a downwardly extending kink 106 may compensate for the tendency. This can be desirable when the bias voltage required to correct the concave down tendency is undesirably large from a circuit or systems level viewpoint. Furthermore, a downwardly extending kink 106 can be utilized to control the displacement of the mechanical layer upon release, which can impact the sacrificial layer thickness needed for a particular gap height, as was described above.

In FIG. 11A, a shaping structure 102 has been deposited and patterned. The shaping structure 102 can be formed, patterned, and have structural and material properties similar to the shaping structure 80 described above with reference to FIG. 9B. The shaping structure 102 can be used to form a downwardly extending kink in the mechanical layer 34, as will be described in further detail below. Although not shown in FIG. 11A, in one embodiment an additional layer, such as an $AlO_x$ layer having a thickness in the range of about 50-150 Å, is deposited before providing the shaping structure 102. The additional layer can, e.g., serve as an etch stop in patterning the shaping structure 102. Also shown in FIG. 11A is a layer 102 deposited over the substrate 20 and the shaping structure 102. The layer can comprise, for example, $AlO_x$ and can have a thickness of, for example, about 50-150 Å, and can also serve as an etch stop in patterning overlying layers.

In FIG. 11B, a black mask structure 62 has been provided over the substrate 20. The details of this processing step are similar to those described above with Reference to FIG. 9A. The black mask structure 62 can be configured to absorb ambient or stray light to improve the optical properties of a display device and/or the structure can be configured to function as an electrical bussing layer. In one embodiment, the thickness of the black mask structure 62 is substantially equal to the thickness of the shaping structure 102 so that the majority of the array has a planar surface.

As illustrated in FIG. 11B, the shaping structure 102 and black mask structure 62 can be spaced by a lateral gap or valley 101. The gap 101 can be used to form a downwardly extending kink in the mechanical layer, in a manner similar to that described with reference to FIGS. 9A-9K. In particular, one or more layers, including the mechanical layer from which the mechanical layer 34 is formed, can be deposited over the shaping structure 102 and the black mask structure 62, thereby substantially replicating one or more geometric features of the shaping or black mask structures.

In FIG. 11C, an interferometric device has been manufactured from the point illustrated in FIG. 11B using steps similar to those described above with reference to FIGS. 9B-9K. As shown, a downwardly extending kink 106 has been formed in the unreleased mechanical layer 34. The kink 106 can be shaped to control the curvature of the mechanical layer 34 and to reduce the amount of vertical displacement of the mechanical layer 34 relative to the tip of the support post 60 upon release. The kink 106 includes a rising portion 107 and a falling portion 108.

Figure 12A:
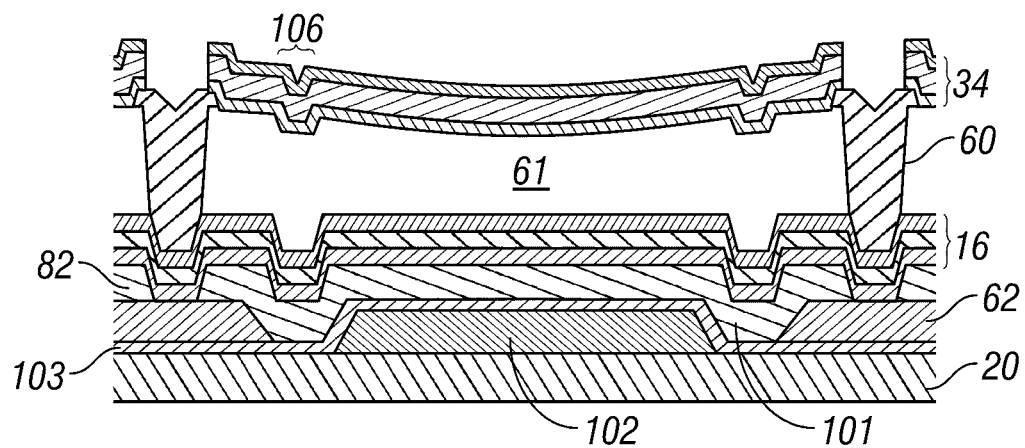
FIG. 12A illustrates a cross-sectional view of the interferometric device of FIG. 11C after release of the sacrificial layer.

FIG. 12A is a cross-sectional view of the interferometric device of FIG. 11C after release, i.e., removal of the sacrificial layer. The illustrated interferometric device includes a support post 60, a mechanical layer 34, a kink 106 and an optical stack 16 formed over a substrate 20. In contrast to the mechanical layer 34 shown in FIG. 11C, the illustrated mechanical layer 34 has been released. The shaping of the kink 106 has resulted in the mechanical layer 34 having a concave up curvature upon release. Additionally, in the illustrated interferometric device 100, the height of the rising portion 107 and the falling portion 108 have been selected to be substantially equal, thereby balancing edge stresses between opposite ends of the kink and minimizing the displacement of the mechanical layer 34 relative to the tip of support post 60.

Figure 12B:
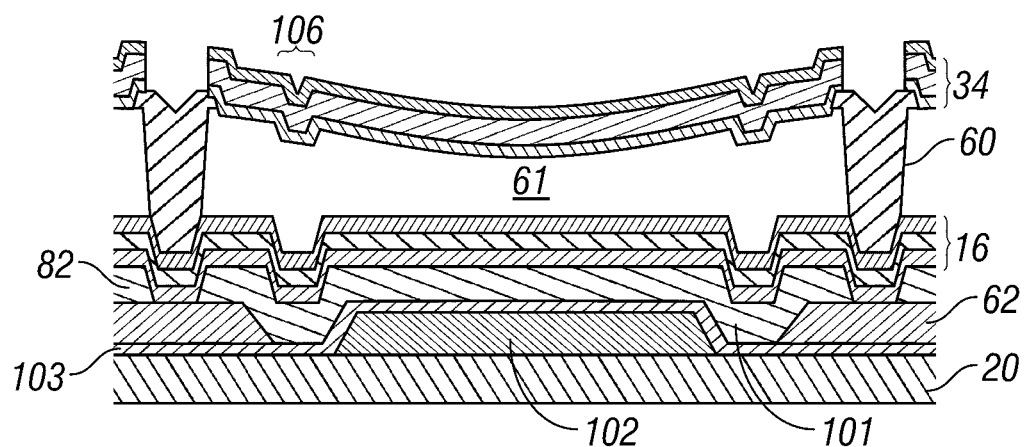
FIG. 12B illustrates a cross-sectional view of the interferometric device of FIG. 12A under bias.

FIG. 12B illustrates a cross-sectional view of the interferometric device of FIG. 12A under bias. The illustrated mechanical layer 34 is concave up after application of a bias voltage. Although the shaping of the mechanical layer can be non-optimal in some optical applications, the ability to shape a minor downward may be useful, as was described in detail above.

Although the embodiments described are often illustrated in the context of interferometric modulator devices, skilled artisans will recognize that the teachings herein are applicable to a wide variety of electromechanical systems devices.

It will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. An electromechanical (EMS) systems device, comprising:
    a substrate;
    a light-absorbing structure on the substrate;
    a movable layer; and
    a support structure on the substrate for supporting the movable layer, wherein the support structure is configured to space the movable layer from the substrate to define a collapsible gap,
    wherein the movable layer includes a kink adjacent to the support structure, wherein the kink includes a rising portion and a falling portion, wherein the rising portion extends away from the gap and the falling portion extends toward the gap, wherein the kink overlaps the light-absorbing structure, wherein the kink is configured to control curvature of the movable layer in such a way that the curvature changes upon application of a bias voltage.

2. The EMS device of claim 1, wherein the kink is spaced from the support structure by less than about 5 μm.

3. The EMS device of claim 2, further comprising a stationary electrode positioned between the substrate and the collapsible gap.

4. The EMS device of claim 3, wherein the stationary electrode is an optical stack.

5. The EMS device of claim 3, wherein the movable layer further comprises a bottom reflective surface facing the gap, and wherein the optical stack and the bottom reflective surface of the movable layer form an interferometric modulator (IMOD).

6. The EMS device of claim 5, further comprising a bias circuit configured to apply the bias voltage, wherein when the bias voltage is applied at least a portion of the movable layer is substantially parallel to the substrate.

7. The EMS device of claim 2, wherein the kink extends away from the substrate.

8. The EMS device of claim 7, wherein the kink divides the movable layer into a first portion and a second portion, wherein the first portion is positioned between the support structure and the rising portion of the kink, and wherein thicknesses of the movable layer along the rising portion, the falling portion, the first portion, and the second portion are substantially equal.

9. The EMS device of claim 8, wherein the rising portion of the kink is spaced from the falling portions of the kink by a width of less than about 5 μm.

10. The EMS device of claim 8, wherein the rising portion contacts the first portion at a first juncture and the falling portion contacts the second portion at a second juncture, wherein a line drawn through the first juncture and the second juncture is substantially parallel to the first portion and the second portion when the movable layer is in the relaxed position.

11. The EMS device of claim 2, wherein a first portion of the kink is elongated along a first side of the support structure, the first side being along the perimeter of the support structure.

12. The EMS device of claim 11, further comprising one or more additional kinks, wherein the kink and the one or more additional kinks surround greater than about 25 percent of the perimeter of the support structure.

13. The EMS device of claim 11, wherein the kink comprises a closed shape, wherein a side of the closed shape is substantially parallel to the first side of the support structure in contact with the movable layer.

14. The EMS device of claim 2, wherein the movable layer comprises a first conductive layer, a second conductive layer, and a supporting layer, wherein the supporting layer is positioned between the first and second conductive layers.

15. The EMS device of claim 2, wherein the kink extends toward the substrate.

16. The EMS device of claim 1, further comprising:
    a display;
    a processor that is configured to communicate with said display, said processor being configured to process image data; and
    a memory device that is configured to communicate with said processor.

17. The EMS device of claim 16, further comprising:
    a driver circuit configured to send at least one signal to said display; and
    a controller configured to send at least a portion of said image data to said driver circuit.

18. The EMS device of claim 17, further comprising:
    an image source module configured to send said image data to said processor.

19. The EMS device of claim 1 wherein the kink is spaced from the support structure by less than a width of the support structure.

20. The EMS device of claim 1, wherein the light-absorbing structure includes a black mask.

21. An electromechanical systems (EMS) device, comprising:
    a substrate means;
    a light-absorbing means on the substrate means;
    a deformable means having a relaxed and an actuated position; and
    a support means for supporting the deformable means and for spacing the deformable means from the substrate by a gap,
    wherein the deformable means comprises a shaping means for directing curvature of the deformable means so that the curvature changes upon application of a bias voltage, wherein the shaping means overlaps the light absorbing means.

22. The EMS device of claim 21, wherein the shaping means is spaced from the support means by less than about 5 μm.

23. The EMS device of claim 21, wherein the shaping means is spaced from the support means by less than a width of the support means.

24. The EMS device of claim 21, wherein the shaping means is adapted to direct the curvature of the deformable means away from the substrate means when the deformable means is in the relaxed position.

25. The EMS device of claim 21, wherein the shaping means includes an elongated rail extending along a side of the support means, the side being along the perimeter of the support means.

26. The EMS device of claim 25, wherein the shaping means includes a kink extending away from the substrate.

27. The EMS device of claim 21, further comprising a fixed electrode positioned between the substrate means and the collapsible gap and a bias means for applying a bias voltage between the fixed electrode and the deformable means, wherein the shaping means is further configured for ensuring flatness of at least a portion of the deformable means when the bias voltage is applied.

28. The EMS device of claim 21, wherein the light-absorbing means includes a black mask.

29. A method of forming a movable layer in an electromechanical systems (EMS) device, comprising:
  providing a substrate;
  depositing a light-absorbing structure over at least a portion of the substrate;
  depositing a support layer over at least a portion of the substrate;
  forming a support post from at least the support layer;
  providing a movable layer with a kink adjacent to the support post, wherein the kink comprises a rising edge and a falling edge, and wherein the kink overlaps the light-absorbing structure, wherein the kink is configured to control curvature of the movable layer in such a way that the curvature changes upon application of a bias voltage; and
  supporting the movable layer with the support post to define a gap over the substrate.

30. The method of claim 29, further comprising depositing a shaping layer over at least a portion of the substrate to form a protrusion, and further comprising depositing a conformal movable layer over the protrusion so that when the movable layer is deposited, the kink is formed in the movable layer over the protrusion.

31. The method of claim 30, wherein a portion of the shaping layer and a portion of the light-absorbing structure are configured to overlap so as to form the protrusion.

32. The method of claim 31, wherein the protrusion comprises the portion of the light-absorbing structure over the portion of the shaping layer.

33. The method of claim 31, wherein the protrusion comprises the portion of the shaping layer over the portion of the light-absorbing structure.

34. The method of claim 30, further comprising:
  depositing a sacrificial layer adjacent to the support layer and over at least a portion of the shaping layer and the light-absorbing structure, wherein the step of depositing the sacrificial layer is performed before depositing the movable layer; and
  removing the sacrificial layer.

35. The method of claim 29, wherein the light-absorbing structure includes a black mask.

* * * * *

UNITED STATES PATENT AND TRADEMARK OFFICE
CERTIFICATE OF CORRECTION

PATENT NO. : 8,547,626 B2  
APPLICATION NO. : 12/731583  
DATED : October 1, 2013  
INVENTOR(S) : Yi Tao et al.

Page 1 of 1

It is certified that error appears in the above-identified patent and that said Letters Patent is hereby corrected as shown below:

In the Specification

In Column 5, Line 57, please change "minor" to --mirror--.

In Column 16, Line 60, please change "minor" to --mirror--.

In Column 21, Line 2, please change "minor" to --mirror--.

Signed and Sealed this  
Tenth Day of June, 2014

Michelle K. Lee  
*Deputy Director of the United States Patent and Trademark Office*